United States Patent [19]

Ogiso et al.

[11] Patent Number: 6,106,999
[45] Date of Patent: Aug. 22, 2000

[54] PHOTOSENSITIZER, VISIBLE LIGHT CURABLE RESIN COMPOSITION USING THE SAME, AND USE OF THE COMPOSITION

[75] Inventors: Akira Ogiso; Tsutami Misawa; Taizo Nishimoto; Hisashi Tsukahara; Keisuke Takuma; Kenichi Sugimoto; Takeshi Tsuda; Genji Imai; Hideo Kogure, all of Kanagawa, Japan

[73] Assignees: Mitsui Chemicals; Kansai Paint Co., Ltd., both of Japan

[21] Appl. No.: 09/131,418

[22] Filed: Aug. 10, 1998

[30] Foreign Application Priority Data

| Aug. 12, 1997 | [JP] | Japan | 9-217721 |
| Apr. 14, 1998 | [JP] | Japan | 10-102794 |
| May 7, 1998 | [JP] | Japan | 10-124947 |
| Jun. 8, 1998 | [JP] | Japan | 10-159493 |
| Jun. 8, 1998 | [JP] | Japan | 10-159494 |
| Jun. 12, 1998 | [JP] | Japan | 10-165044 |
| Jun. 12, 1998 | [JP] | Japan | 10-165045 |

[51] Int. Cl.$^7$ .................................................. G03C 1/105
[52] U.S. Cl. .................................. 430/281.1; 430/270.1; 430/926; 430/913; 522/29; 548/405
[58] Field of Search ........................... 430/270.1, 281.1, 430/286.1, 154, 913, 916, 926; 522/26, 29, 182, 184, 121; 548/405

[56] References Cited

U.S. PATENT DOCUMENTS

| 5,338,854 | 8/1994 | Kang et al. | 548/110 |
| 5,446,157 | 8/1995 | Morgan et al. | 546/13 |
| 5,498,641 | 3/1996 | Urano et al. . | |
| 5,723,218 | 3/1998 | Haugland et la. | 428/402 |

FOREIGN PATENT DOCUMENTS

| 0619520 | 1/1996 | European Pat. Off. . |
| 822544 | 2/1998 | European Pat. Off. . |
| 241338 | 9/1993 | Japan . |
| 6245 | 1/1996 | Japan . |
| 76377 | 3/1996 | Japan . |
| 95244 | 4/1996 | Japan . |
| 179504 | 7/1996 | Japan . |
| 258444 | 10/1997 | Japan . |
| 104826 | 4/1998 | Japan . |

OTHER PUBLICATIONS

Boyer, Joseph H. et al.; "Pyrromethene–BF2 complexes as laser dyes." (Dept. Chem., Univ. New Orleans, New Orleans, LA 70148, USA). Heteroat. Chem., 4(1), 39–49 (English) 1993. (and abstract).

Falk, Heinz et al.; "Chemistry of pyrrole pigments. Part XX. Studies on the deprotonation equilibrium and the formation of mental complexes of partial structures of bile pigments." (Inst. Org. Chem. Unive. Wien, Vienna, Austria). Monatsh. Chem., 109(4), (and abstract), 1978.

Falk, Heinz et al.; "Contribution to the chemistry of pyrrole pigments, XIX: The electrochemical oxidation of pyrromethenones and pyrromethenes (bile pigment partial structures)." (Inst. Org. Chem. Unive. Wien, Vienna, Austria). Monatsh. Chem., 109(1), (and abstract), 1978.

Misawa, Nobuyoshi et al.; "Dipyrromethene metal chelate compounds . . . " Japanese Patent No. 10162430 (abstract); Jun. 19, 1998.

*Primary Examiner*—Janet Baxter
*Assistant Examiner*—Yvette M. Clarke
*Attorney, Agent, or Firm*—Burns, Doane, Swecker & Mathis, L.L.P.

[57] ABSTRACT

A visible light curable resin composition containing a photocurable resin, a photoreaction initiator and a photosensitizer having the formula (1). The composition has a very high sensitivity to a general-purpose visible light laser, so that a high-speed scanning exposure is possible by the laser, and an extremely fine high resolution can be obtained. In addition, the composition can be used for coating or printing under safelight irradiating conditions and under bright circumstantial conditions without any thickening of the composition, and hence the composition can exert excellent noticeable effects in points of safe operativity, operational efficiency and the stability of products. Formula (1) is as follows:

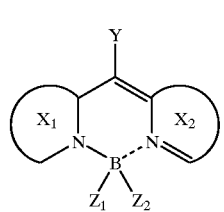

(1)

wherein rings $X_1$ and $X_2$ are each an optionally substituted pyrrole ring; Y is H, CN, optionally substituted alkyl, aralkyl, aryl, heteroaryl or alkenyl group; and $Z_1$ and $Z_2$ are halogen, optionally substituted alkyl, alkoxy, alkylthio, aralkyl, aralkyloxy, aryl, aryloxy, arylthio, heteroaryl, heteroaryloxy or heteroarylthio group, provided that at least one of substituents on the pyrrole rings $X_1$ and $X_2$, groups $Z_1$ and $Z_2$ is the alkoxy, aralkyloxy or aryloxy group.

35 Claims, 3 Drawing Sheets

PHOTOSENSITIZER, VISIBLE LIGHT CURABLE RESIN COMPOSITION USING THE SAME, AND USE OF THE COMPOSITION

BACKGROUND OF THE INVENTION

1. Field of the Invention

The present invention relates to a photosensitizer in which a dipyrromethene boron complex compound having a specific structure is used, and a visible light curable resin composition which contains the above-mentioned photosensitizer and hence shows a high sensitivity to a light in a visible light range.

Furthermore, the present invention relates to a visible light curable resin composition in which the prevention effect of curing by oxygen is improved and which can exhibit a high sensitivity to a light in a visible light range and is excellent in curing properties.

In addition, the present invention relates to a visible light curable resin composition which can be used under the irradiation environment of a specific safelight.

2. Description of the Related Art

In recent years, in the field of information or image recording which utilizes a photopolymerization reaction, there has been investigated a technique where a manuscript electronically edited by a computer can be directly output and recorded by the use of a high power laser, in place of the conventional recording technique of a film manuscript or the like by an ultraviolet light. The above-mentioned recent technique has an advantage that direct writing is done by the laser, so that recording and image-formation steps can be remarkably simplified.

Nowadays, much of high-power and stable laser light sources which have usually been used possess output wavelengths in a visible light range. Concretely, an argon laser having stable oscillation lines at wavelengths of 488 nm and 514.5 nm and a YAG laser having a bright line at 532 nm as a second harmonic are often used. Therefore, a compound having a high sensitivity to these wavelengths has been desired, but a conventional photosensitizer for the ultraviolet light cannot be used because of a low sensitivity in the visible light range. Moreover, by the addition of a pyrylium salt or a thiopyrylium salt, the sensitivity in the visible light range can be improved, but a photosensitive layer containing such a compound is poor in storage stability, which makes its use difficult.

As compounds having photosensitivity in the visible light range, there are known, for example, 7-diethylamino-3-benzothiazoylcoumarin (trivial name: coumarin-6) and bis[3-(7-diethylaminocoumaryl)] ketone (trivial name: ketocoumarin), but these compounds have maximum absorption wavelengths in the vicinity of 450 nm, which is shorter than 488 nm of the argon laser, and hence the photosensitivity is insufficient. In addition, a 4-substituted-3-benzothiazoylcoumarin compound described in Japanese Patent Application Laid-Open No. 18088/1992 has the high photosensitivity at 488 nm of the argon laser, but it scarcely has absorptions at 514.5 nm and 532 nm that is the second harmonic of the YAG laser. Thus, this kind of compound is poor to sufficiently improve the photosensitivity.

European Patent No. 0619520, U.S. Pat. No. 5,498,641, Japanese Patent Application Laid-Open Nos. 258444/1997, 179504/1996, 95244/1996, 76377/1996, 6245/1996, 225474/1995, 219223/1995, 5685/1995 and 241338/1993 disclose bispyrromethene boron compounds, but these compounds are poor to sufficiently improve the sensitivity to the above-mentioned laser light and the storage stability of the photosensitive layer.

On the other hand, a conductor circuit such as a printed-wiring board has been heretofore formed by exposing and developing the board coated with a photosensitive resist to prepare a resist pattern, and then removing unnecessary portions therefrom by etching.

With regard to an exposure technique, there are a method of exposing the board through a photo mask, and another method of directly drawing a resist by a laser. In the method of exposing the board through the photo mask, there are a problem that extensive time is taken for the positioning of the photo mask, and another problem that when the surface of the resist is tacky, the positioning of the photo mask is more difficult.

In the method of directly drawing the resist by the laser, this resist is required to be highly sensitive, because an exposure time is very short. Accordingly, it has usually been conducted to cover a resist surface with an oxygen-blocking layer such as a cover coat or a cover film so that active radicals generated by the irradiation of the laser may not be deactivated by oxygen in air, whereby oxygen can be blocked and hence the high sensitivity can be maintained. However, this operation is inconveniently troublesome.

Moreover, in the case that the above-mentioned visible light curable resin composition which can be cured by the visible light is handled, an electric lamp such as a fluorescent lamp colored by coating an outer tube of the lamp with a dark red colorant or by winding a dark red film around the outer tube is used as a safelight (a working lamp). Under the environment of such a dark red safelight, however, some problems are present. For example, it is difficult to inspect the state of a coated film after the coating, and it is not easy to inspect a coating device, an irradiation device, a conveying device and the like. In consequence, safe working properties, working efficiency, the quality stability of products and the like are poor. In addition, in the case that an uncolored fluorescent lamp is used as the safelight, the working environment is lightened and there are not the above-mentioned problems any more, but even portions where the exposure is not required might be exposed inconveniently, depending on the kind of photosensitive resin.

SUMMARY OF THE INVENTION

An object of the present invention is to provide a visible light curable resin composition containing a photosensitizer which is excellent in storage stability and which is highly sensitive to a laser light having long wavelength in a visible light range such as an oscillation line at 514.5 nm of an argon laser which is a high-power and stable laser light source, or a second harmonic of a YAG laser at 532 nm.

Another object of the present invention is to provide a resist in which active radicals generated on the resist by the irradiation of the laser are scarcely deactivated by oxygen in air in a method of directly drawing images on the resist by a visible light laser without using any photo mask and which can maintain a high sensitivity.

Still another object of the present invention is to provide a visible light curable resin composition which can be handled under an irradiation environment of a specific bright safelight and which is excellent in sensitivity.

The present inventors have intensively investigated to solve the above-mentioned problems, and as a result, a photosensitizer including a compound having a specific structure has been found. In addition, it has also been found that developing a visible light curable resin composition in which this photosensitizer is used can solve the problems of the conventional techniques. In consequence, the present invention has been completed.

That is to say, the first aspect of the present invention is directed to a photosensitizer using at least one of dipyrromethene boron complex compounds represented by formula (1):

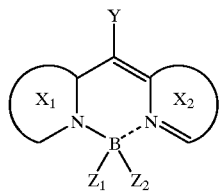

(1)

wherein rings $X_1$ and $X_2$ are each a pyrrole ring which may have a substituent or substituents; Y is a hydrogen atom, a cyano group, or an alkyl, an aralkyl, an aryl, a heteroaryl or an alkenyl group which may have a substituent or substituents; and $Z_1$ and $Z_2$ are each independently a halogen atom, or an alkoxy, an alkyl, an aralkyl, an aralkyloxy, an aryl, a heteroaryl, an alkylthio, an aryloxy, an arylthio, a heteroaryloxy or a heteroarylthio group which may have a substituent or substituents, provided that at least one of substituents on the pyrrole rings $X_1$ and $X_2$ as well as the groups $Z_1$ and $Z_2$ is an alkoxy, an aralkyloxy or an aryloxy group which may have a substituent or substituents.

The second aspect of the present invention is directed to a visible light curable resin composition, which comprises (A) a photocurable resin, (B) a photoreaction initiator and (C) the above-mentioned photosensitizer.

The third aspect of the present invention is directed to a composition for a visible light curable material, which comprises the visible light curable resin composition of the present invention and a solvent.

The fourth aspect of the present invention is directed to a visible light curable material, which comprises a substrate and the visible light curable resin composition thereon.

In the present invention, the visible light curable resin composition containing a specific compound as the photosensitizer is an extremely useful composition in practice. Heretofore, in the field of information storage in which a photocuring reaction is used, a conventional system where a manuscript electronically edited by a computer is directly output and stored by the use of a laser has some disadvantages. For example, the stability of a photosensitive layer is poor with time, its sensitivity is low, and its solubility and storage stability are insufficient.

However, the visible light curable resin composition of the present invention is extremely compatible with the photocurable resin and the photosensitizer, and in addition, it is soluble in a general-purpose coating solution. In consequence, this composition permits obtaining a uniform coating surface having an excellent storage stability with time on a substrate.

In addition, the photosensitizer of a dipyrromethene boron complex compound having a specific structure which can be used in the present invention has a very high sensitivity to a general-purpose visible light laser such as an argon laser having stable oscillation lines at 488 nm and 514.5 nm, and a YAG laser having a bright line at 532 nm as a second harmonic. Therefore, for a photosensitive material obtained by using the visible light curable resin composition of the present invention, a high-speed scanning exposure is possible by such a laser. Furthermore, when an image is formed by the high-speed scanning exposure, the image having an extremely fine high resolution can be obtained.

The visible light curable resin composition of the present invention can be used for coating or printing under safelight irradiating conditions and under bright circumstantial conditions without any thickening of the composition, and hence the above-mentioned resin composition can exert noticeably excellent effects in points of safe operativity, operational efficiency, the quality stability of products, and the like.

DETAILED DESCRIPTION OF THE PREFERRED EMBODIMENTS

Figure 1:
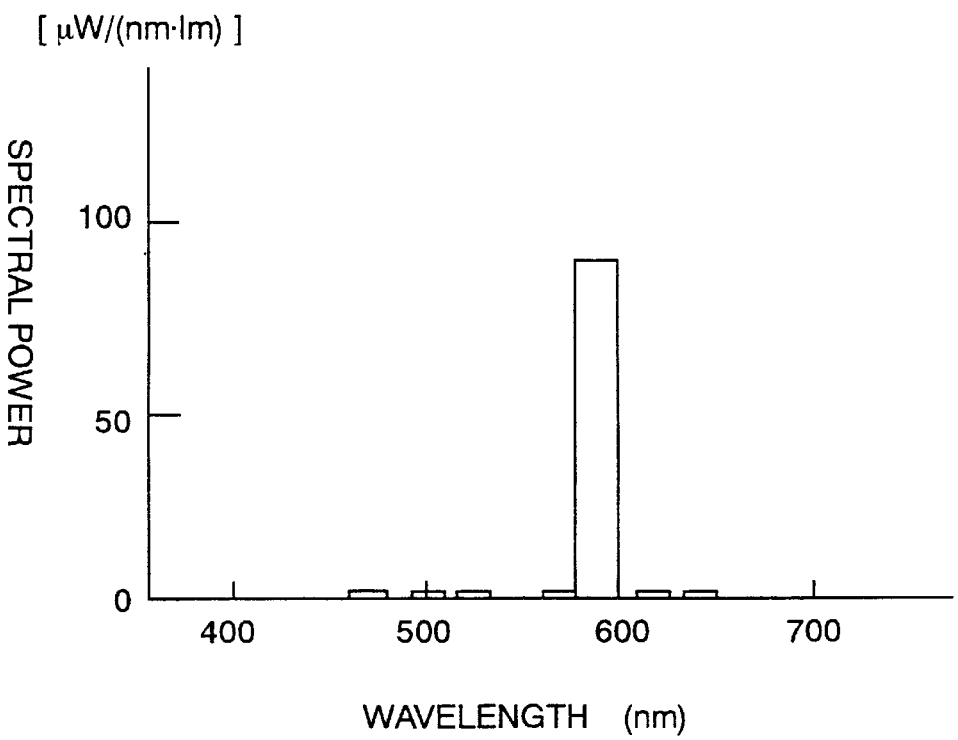
FIG. 1 is a graph showing one example of a spectral distribution of a discharge lamp of a safelight containing sodium as a main component which can be used in the present invention.

The present invention is characterized by using, as a photosensitizer, a dipyrromethene boron complex compound represented by the above-mentioned formula (1).

The photosensitizer in which the dipyrromethene boron complex compound represented by formula (1) is used can absorb light within a visual light range of 400 to 700 nm, particularly a light of 400 to 600 nm, whereby it is excited, and when the photosensitizer is used in a visible light curable resin composition, this photosensitizer carries out interaction with a photocurable resin (A) and a photoreaction initiator (B) constituting the composition. The term "interaction" referred herein includes an energy transfer or an electron transfer from the excited photosensitizer (C) for use in the present invention to the photocurable resin (A) or the photoreaction initiator (B).

The present inventors have found that a photosensitizer in which the dipyrromethene boron complex compound represented by the above-mentioned formula (1) is used is extremely useful, and when at least one of substituents present on a dipyrromethene boron complex structure of the compound represented by formula (1) is an alkoxy group, an aralkyloxy group or an aryloxy group, an excellent photosensitivity can be expressed. In addition, it has also been found that when the boron atom has the alkoxy group, the aralkyloxy group or the aryloxy group as a substituent, the photosensitivity can be surprisingly improved. The dipyrromethene boron complex compound represented by formula (1) is an extremely useful compound as the photosensitizer which has an extremely large absorbency to wavelengths of the light from an argon laser and the second harmonic light from a YAG laser and which is very sensitive to these lights and is applicable to a negative photosensitive resin composition using the photocurable resin and the photoreaction initiator.

Incidentally, "a composition for a visible light curable material" referred to in the present invention means, for example, a photosensitive coating composition, a photosensitive ink, a photosensitive adhesive, a photosensitive printing plate material, a photosensitive resist material or an unexposed coating material formed therefrom in which the visible light curable resin composition of the present invention is contained.

Next, the present invention will be described in more detail.

A compound of the present invention represented by formula (1) having pyrrole rings which are represented by rings $X_1$ and $X_2$ and which may have substituents can be concretely represented by formula (2):

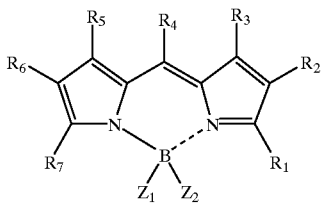

(2)

wherein $R_1$, $R_2$, $R_3$, $R_5$, $R_6$ and $R_7$ are each independently a hydrogen atom, a halogen atom, a cyano group, a hydroxyl group, an amino group, an alkyl, an alkoxy or an alkylthio group having 1 to 20 carbon atoms which may have a substituent or substituents, an aryl, an aryloxy or an arylthio group having 6 to 20 carbon atoms which may have a substituent or substituents, an aralkyl or an aralkyloxy group having 7 to 20 carbon atoms which may have a substituent or substituents, a heteroaryl group having 2 to 20 carbon atoms which may have a substituent or substituents, an alkenyl group having 2 to 10 carbon atoms which may have a substituent or substituents, or a group represented by formula (3) or (4):

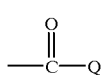

(3)

wherein Q is a hydrogen atom, an amino group, an alkyl or an alkoxy group having 1 to 20 carbon atoms which may have a substituent or substituents, an aralkyl or an aralkyloxy group having 7 to 20 carbon atoms which may have a substituent or substituents, an aryl, an aryloxy or an arylamino group having 6 to 20 carbon atoms which may have a substituent or substituents, an alkenyloxy group having 2 to 10 carbon atoms which may have a substituent or substituents, a monoalkylamino group having 1 to 10 carbon atoms which may have a substituent or substituents, a dialkylamino group having 2 to 20 carbon atoms which may have a substituent or substituents, or an alkylcarbonylalkoxy group or an alkoxycarbonylalkoxy group having 3 to 20 carbon atoms which may have a substituent or substituents,

—NH—L (4)

wherein L is an alkylcarbonyl group having 2 to 10 carbon atoms which may have a substituent or substituents or an arylcarbonyl group having 7 to 15 carbon atoms which may have a substituent or substituents;
$R_4$ is a hydrogen atom, a cyano group, an alkyl group having 1 to 20 carbon atoms which may have a substituent or substituents, an aralkyl group having 7 to 20 carbon atoms which may have a substituent or substituents, an aryl group having 6 to 20 carbon atoms which may have a substituent or substituents, a heteroaryl group having 2 to 20 carbon atoms which may have a substituent or substituents, or an alkenyl group having 2 to 10 carbon atoms which may have a substituent or substituents;
$Z_1$ and $Z_2$ are each independently a halogen atom, an alkyl group, an alkoxy or an alkylthio group having 1 to 20 carbon atoms which may have a substituent or substituents, an aralkyl or an aralkyloxy group having 7 to 20 carbon atoms which may have a substituent or substituents, an aryl, an aryloxy or an arylthio group having 6 to 20 carbon atoms which may have a substituent or substituents, a heteroaryl, a heteroaryloxy or a heteroarylthio group having 2 to 20 carbon atoms which may have a substituent or substituents; provided that at least one of $R_1$, $R_2$, $R_3$, $R_5$, $R_6$ and $R_7$ is the alkoxy, aralkyloxy or aryloxy group.

The compound represented by formula (1) can also be represented by formula (5):

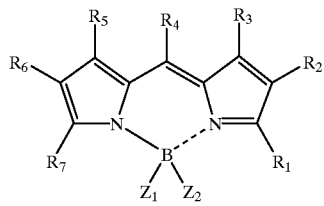

(5)

wherein $R_1$, $R_2$, $R_3$, $R_5$, $R_6$ and $R_7$ are each independently a hydrogen atom, a halogen atom, a cyano group, a hydroxyl group, an amino group, an alkyl or an alkylthio group having 1 to 20 carbon atoms which may have a substituent or substituents, an aryl or an arylthio group having 6 to 20 carbon atoms which may have a substituent or substituents, an aralkyl group having 7 to 20 carbon atoms which may have a substituent or substituents, a heteroaryl group having 2 to 20 carbon atoms which may have a substituent or substituents, an alkenyl group having 2 to 10 carbon atoms which may have a substituent or substituents, or a group represented by formula (3) or (4):

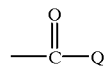

(3)

wherein Q is a hydrogen atom, an amino group, an alkyl or an alkoxy group having 1 to 20 carbon atoms which may have a substituent or substituents, an aralkyl or an aralkyloxy group having 7 to 20 carbon atoms which may have a substituent or substituents, an aryl, an aryloxy or an arylamino group having 6 to 20 carbon atoms which may have a substituent or substituents, an alkenyloxy group having 2 to 10 carbon atoms which may have a substituent or substituents, a monoalkylamino group having 1 to 10 carbon atoms which may have a substituent or substituents, a dialkylamino group having 2 to 20 carbon atoms which may have a substituent or substituents, or an alkylcarbonylalkoxy group or an alkoxycarbonylalkoxy group having 3 to 20 carbon atoms which may have a substituent or substituents,

—NH—L (4)

wherein L is an alkylcarbonyl group having 2 to 10 carbon atoms which may have a substituent or substituents or an arylcarbonyl group having 7 to 15 carbon atoms which may have a substituent or substituents;

$R_4$ is a hydrogen atom, a cyano group, an alkyl group having 1 to 20 carbon atoms which may have a substituent or substituents, an aralkyl group having 7 to 20 carbon atoms which may have a substituent or substituents, an aryl group having 6 to 20 carbon atoms which may have a substituent or substituents, a heteroaryl group having 2 to 20 carbon atoms which may have a substituent or substituents, or an alkenyl group having 2 to 10 carbon atoms which may have a substituent or substituents;

$Z_1$ and $Z_2$ are each independently a halogen atom, an alkyl, an alkoxy or an alkylthio group having 1 to 20 carbon atoms which may have a substituent or substituents, an aralkyl or an aralkyloxy group having 7 to 20 carbon atoms which may have a substituent or substituents, an aryl, an aryloxy or an arylthio group having 6 to 20 carbon atoms which may have a substituent or substituents, a heteroaryl, a heteroaryloxy or a heteroarylthio group having 2 to 20 carbon atoms which may have a substituent or substituents;

provided that at least one of $Z_1$ and $Z_2$ is the alkoxy, aralkyloxy or aryloxy group.

In formula (1), examples of the preferable substituents on the pyrrole rings include an alkoxy group having 1 to 20 carbon atoms which may have a substituent or substituents, an aryloxy group having 6 to 20 carbon atoms which may have a substituent or substituents, and an aralkyloxy group having 7 to 20 carbon atoms which may have a substituent or substituents.

Furthermore, typical examples of a substituent Y at the metho-position of a dipyrromethene skeleton include a hydrogen atom, a cyano group, an alkyl, an aryl, a heteroaryl and an alkenyl group which may have a substituent or substituents.

In addition, typical examples of the substituents Z, $Z_2$ bearing on boron atom in the compound of formula (1) include a halogen atom, and an alkoxy, an alkyl, an aralkyl, an aralkyloxy, an aryl, a heteroaryl, an alkylthio, an aryloxy, an arylthio, a heteroaryloxy and a heteroarylthio group which may have a substituent or substituents. Examples of the preferable substituents include an alkoxy group having 1 to 20 carbon atoms which may have a substituent or substituents, an aralkyloxy group having 7 to 20 carbon atoms, and straight chain, branched and cyclic alkoxy groups having 1 to 7 carbon atoms and benzyloxy groups which may have a substituent or substituents.

In the compound represented by formula (2) or (5) regarding the present invention, typical examples of $R_1$, $R_2$, $R_3$, $R_5$, $R_6$ and $R_7$ include a hydrogen atom, a cyano group, a hydroxyl group, and halogen atoms such as a fluorine atom, a chlorine atom and a bromine atom.

Examples of the alkyl groups having 20 or less carbon atoms represented by $R_1$, $R_2$, $R_3$, $R_5$, $R_6$ and $R_7$ which may have a substituent or substituents include straight chain, branched and cyclic alkyl groups having 1 to 20 carbon atoms such as a methyl group, ethyl group, n-propyl group, isopropyl group, n-butyl group, isobutyl group, tert-butyl group, sec-butyl group, n-pentyl group, isopentyl group, tert-pentyl group, sec-pentyl group, cyclopentyl group, n-hexyl group, 1-methylpentyl group, 2-methylpentyl group, 3-methylpentyl group, 4-methylpentyl group 1,1-dimethylbutyl group, 1,2-dimethylbutyl group, 1,3-dimethylbutyl group, 2,3-dimethylbutyl group, 1,1,2-trimethylpropyl group, 1,2,2-trimethylpropyl group, 1-ethylbutyl group, 2-ethylbutyl group, 1-ethyl-2-methylpropyl group, cyclohexyl group, methylcyclopentyl group, n-heptyl group, 1-methylhexyl group, 2-methylhexyl group, 3-methylhexyl group, 4-methylhexyl group, 5-methylhexyl group, 1,1-dimethylpentyl group, 1,2-dimethylpentyl group, 1,3-dimethylpentyl group, 1,4-dimethylpentyl group, 2,2-dimethylpentyl group, 2,3-dimethylpentyl group, 2,4-dimethylpentyl group, 3,3-dimethylpentyl group, 3,4-dimethylpentyl group, 1-ethylpentyl group, 2-ethylpentyl group, 3-ethylpentyl group, 1,1,2-trimethyl butyl group, 1,1,3-trimethyl butyl group, 1,2,3-trimethyl butyl group, 1,2,2-trimethylbutyl group, 1,3,3-trimethylbutyl group, 2,3,3-trimethylbutyl group, 1-ethyl-1-methylbutyl group, 1-ethyl-2-methylbutyl group, 1-ethyl-3-methylbutyl group, 2-ethyl-1-methylbutyl group, 2-ethyl-3-methylbutyl group, 1-n-propylbutyl group, 1-isopropylbutyl group, 1-isopropyl-2-methylpropyl group, methylcyclohexyl groups, n-octyl group, 1-methylheptyl group, 2-methylheptyl group, 3-methylheptyl group, 4-methylheptyl group, 5-methylheptyl group, 6-methylheptyl group, 1,1-dimethylhexyl group, 1,2-dimethylhexyl group, 1,3-dimethylhexyl group, 1,4-dimethylhexyl group, 1,5-dimethylhexyl group, 2,2-dimethylhexyl group, 2,3-dimethylhexyl group, 2,4-dimethylhexyl group, 2,5-dimethylhexyl group, 3,3-dimethylhexyl group, 3,4-dimethylhexyl group, 3,5-dimethylhexyl group, 4,4-dimethylhexyl group, 4,5-dimethylhexyl group, 1-ethylhexyl group, 2-ethylhexyl group, 3-ethylhexyl group, 4-ethylhexyl group, 1-n-propylpentyl group, 2-n-propylpentyl group, 1-isopropylpentyl group, 2-isopropylpentyl group, 1-ethyl-1-methylpentyl group, 1-ethyl-2-methylpentyl group, 1-ethyl-3-methylpentyl group, 1-ethyl-4-methylpentyl group, 2-ethyl-1-methylpentyl group, 2-ethyl-2-methylpentyl group, 2-ethyl-3-methylpentyl group, 2-ethyl-4-methylpentyl group, 3-ethyl-1-methylpentyl group, 3-ethyl-2-methylpentyl group, 3-ethyl-3-methylpentyl group, 3-ethyl-4-methylpentyl group, 1,1,2-trimethylpentyl group, 1,1,3-trimethylpentyl group, 1,1,4-trimethylpentyl group, 1,2,2-trimethylpentyl group, 1,2,3-trimethylpentyl group, 1,2,4-trimethylpentyl group, 1,3,4-trimethylpentyl group, 2,2,3-trimethylpentyl group, 2,2,4-trimethylpentyl group, 2,3,4-trimethylpentyl group, 1,3,3-trimethylpentyl group, 2,3,3-trimethylpentyl group, 3,3,4-trimethylpentyl group, 1,4,4-trimethylpentyl group, 2,4,4-trimethylpentyl group, 3,4,4-trimethylpentyl group, 1-n-butylbutyl group, 1-isobutylbutyl group, 1-sec-butylbutyl group, 1-tert-butylbutyl group, 2-tert-butylbutyl group, 1-n-propyl-1-methylbutyl group, 1-n-propyl-2-methylbutyl group, 1-n-propyl-3-methylbutyl group, 1-isopropyl-1-methylbutyl group, 1-isopropyl-2-methylbutyl group, 1-isopropyl-3-methylbutyl group, 1,1-diethylbutyl group, 1,2-diethylbutyl group, 1-ethyl-1,2-dimethylbutyl group, 1-ethyl-1,3-dimethylbutyl group, 1-ethyl-2,3-dimethylbutyl group, 2-ethyl-1,1-dimethylbutyl group, 2-ethyl-1,2-dimethylbutyl group, 2-ethyl-1,3-dimethylbutyl group, 2-ethyl-2,3-dimethylbutyl group, 1,2-dimethylcyclohexyl group, 1,3-dimethylcyclohexyl group, 1,4-dimethylcyclohexyl group, ethylcyclohexyl groups, n-nonyl group, 3,5,5-trimethylhexyl group, n-decyl group, n-undecyl group, n-dodecyl group, n-pentadecanyl group, decalyl group, adamantyl group, icosanyl group and 4-t-butylcyclohexyldecyl group;

Alkyl groups substituted by a hydroxy group and having 1 to 10 carbon atoms such as hydroxymethyl group, hydroxyethyl groups, hydroxypropyl groups and hydroxydecyl groups;

alkyl groups substituted by one or more halogen atoms and having 1 to 20 carbon atoms such as a chloromethyl group, dichloromethyl group, fluoromethyl group, trifluoromethyl group, pentafluoroethyl group, 1,1,1,3,3,3-hexafluoro-2-propyl group, nonafluorobutyl group, perfluorodecyl group and perfluoroicosanyl group;

alkyl groups substituted by an alkoxy group and having 2 to 20 carbon atoms such as a methoxymethyl group, methoxyethyl group, ethoxyethyl group, n-propoxyethyl group, isopropoxyethyl group, n-butoxyethyl group, isobutoxyethyl group, tert-butoxyethyl group, sec-butoxyethyl group, n-pentyloxyethyl group, isopentyloxyethyl group, tert-pentyloxyethyl group, sec-pentyloxyethyl group, cyclopentyloxyethyl group, n-hexyloxyethyl group, ethylcyclohexyloxyethyl group, n-nonyloxyethyl group, 3,5,5-trimethylhexyloxyethyl group, n-decyloxyethyl group, n-undecyloxyethyl group, n-dodecyloxyethyl group, n-heptadecanyloxyethyl group, octadecanoxyethyl group, 3-methoxypropyl group, 3-ethoxypropyl group, 3-(n-propoxy)propyl group, 2-isopropoxypropyl group, 2-methoxybutyl group, 2-ethoxybutyl group, 2-(n-propoxy)butyl group, 4-isopropoxybutyl group, decalyloxyethyl group and adamantyloxyethyl group;

alkyl groups substituted by an alkoxyalkoxy group and having 3 to 20 carbon atoms such as a methoxymethoxymethyl group, methoxyethoxyethyl group, ethoxyethoxyethyl group, propoxyethoxyethyl group, isobutoxypropoxyethyl group and 4-(4-decanoxycyclohexyloxy)butyl group;

alkyl groups substituted by an aryloxy group and having 7 to 20 carbon atoms such as a phenoxymethyl group, phenoxyethyl group, (3-methylphenyloxy)ethyl group and 4-(1-pyrenyloxy)butyl group;

alkyl groups substituted by an aralkyloxy group and having 8 to 20 carbon atoms such as a benzyloxymethyl group, benzyloxyethyl group, phenetyloxyethyl group and 9-fluorenylmethoxyhexyl group;

alkyl groups substituted by an alkylthio group and having 2 to 20 carbon atoms such as a 2-methylthioethyl group, 2-ethylthioethyl group, 2-n-propylthioethyl group, 2-iso-propylthioethyl group, 2-n-butylthioethyl group, 2-iso-butylthioethyl group and octadecylthioethyl group; and alkyl groups substituted by a dialkylamino group and having 3 to 20 carbon atoms such as a 2-dimethylaminomethyl group, 2-dimethylaminoethyl group, 4-dimethylaminobutyl group, 1-dimethylaminopropan-2-yl group, 3-dimethylaminopropyl group, 2-diisopropylaminoethyl group, 2-di-n-butylaminoethyl group, piperidinoethyl group and 4-(di-n-octylamino)butyl group.

Examples of the alkoxy groups having 1 to 20 carbon atoms which are represented by $R_1$, $R_2$, $R_3$, $R_5$, $R_6$ and $R_7$ and which may have a substituent or substituents include straight chain, branched and cyclic alkoxy groups having 1 to 20 carbon atoms such as a methoxy group, ethoxy group, n-propoxy group, isopropoxy group, n-butoxy group, isobutoxy group, tert-butoxy group, sec-butoxy group, n-pentyloxy group, isopentyloxy group, tert-pentyloxy group, sec-pentyloxy group, cyclopentyloxy group, n-hexyloxy group, 1-methylpentyloxy group, 2-methylpentyloxy group, 3-methylpentyloxy group, 4-methylpentyloxy group, 1,1-dimethylbutoxy group, 1,2-dimethylbutoxy group, 1,3-dimethylbutoxy group, 2,3-dimethylbutoxy group, 1,1,2-trimethylpropoxy group, 1,2,2-trimethylpropoxy group, 1-ethylbutoxy group, 2-ethylbutoxy group, 1-ethyl-2-methylpropoxy group, cyclohexyloxy group, methylcyclopentyloxy groups, n-heptyloxy group, 1-methylhexyloxy group, 2-methylhexyloxy group, 3-methylhexyloxy group, 4-methylhexyloxy group, 5-methylhexyloxy group, 1,1-dimethylpentyloxy group, 1,2-dimethylpentyloxy group, 1,3-dimethylpentyloxy group, 1,4-dimethylpentyloxy group, 2,2-dimethylpentyloxy group, 2,3-dimethylpentyloxy group, 2,4-dimethylpentyloxy group, 3,3-dimethylpentyloxy group, 3,4-dimethylpentyloxy group, 1-ethylpentyloxy group, 2-ethylpentyloxy group, 3-ethylpentyloxy group, 1,1,2-trimethylbutoxy group, 1,1,3-trimethylbutoxy group, 1,2,3-trimethylbutoxy group, 1,2,2-trimethylbutoxy group, 1,3,3-trimethylbutoxy group, 2,3,3-trimethylbutoxy group, 1-ethyl-1-methylbutoxy group, 1-ethyl-2-methylbutoxy group, 1-ethyl-3-methylbutoxy group, 2-ethyl-1-methylbutoxy group, 2-ethyl-3-methylbutoxy group, 1-n-propylbutoxy group, 1-isopropylbutoxy group, 1-isopropyl-2-methylpropoxy group, methylcyclohexyloxy groups, n-octyloxy group, 1-methylheptyloxy group, 2-methylheptyloxy group, 3-methylheptyloxy group, 4-methylheptyloxy group, 5-methylheptyloxy group, 6-methylheptyloxy group, 1,1-dimethylhexyloxy group, 1,2-dimethylhexyloxy group, 1,3-dimethylhexyloxy group, 1,4-dimethylhexyloxy group, 1,5-dimethylhexyloxy group, 2,2-dimethylhexyloxy group, 2,3-dimethylhexyloxy group, 2,4-dimethylhexyloxy group, 2,5-dimethylhexyloxy group, 3,3-dimethylhexyloxy group, 3,4-dimethylhexyloxy group, 3,5-dimethylhexyloxy group, 4,4-dimethylhexyloxy group, 4,5-dimethylhexyloxy group, 1-ethylhexyloxy group, 2-ethylhexyloxy group, 3-ethylhexyloxy group, 4-ethylhexyloxy group, 1-n-propylpentyloxy group, 2-n-propylpentyloxy group, 1-isopropylpentyloxy group, 2-isopropylpentyloxy group, 1-ethyl-1-methylpentyloxy group, 1-ethyl-2-methylpentyloxy group, 1-ethyl-3-methylpentyloxy group, 1-ethyl-4-methylpentyloxy group, 2-ethyl-3-methylpentyloxy group, 2-ethyl-2-methylpentyloxy group, 2-ethyl-3-methylpentyloxy group, 2-ethyl-4-methylpentyloxy group, 3-ethyl-1-ethylpentyloxy group, 3-ethyl-2-methylpentyloxy group, 3-ethyl-3-methylpentyloxy group, 3-ethyl-4-methylpentyloxy group, 1,1,2-trimethylpentyloxy group, 1,1,3-trimethylpentyloxy group, 1,1,4-trimethylpentyloxy group, 1,2,2-trimethylpentyloxy group, 1,2,3-trimethylpentyloxy group, 1,2,4-trimethylpentyloxy group, 1,3,4-trimethylpentyloxy group, 2,2,3-trimethylpentyloxy group, 2,2,4-trimethylpentyloxy group, 2,3,4-trimethylpentyloxy group, 1,3,3-trimethylpentyloxy group, 2,3,3-trimethylpentyloxy group, 3,3,4-trimethylpentyloxy group, 1,4,4-trimethylpentyloxy group, 2,4,4-trimethylpentyloxy group, 3,4,4-trimethylpentyloxy group, 1-n-butylbutoxy group, 1-isobutylbutoxy group, 1-sec-butylbutoxy group, 1-tert-butylbutoxy group, 2-tert-butylbutoxy group, 1-n-propyl-1-methylbutoxy group, 1-n-propyl-2-methylbutoxy group, 1-n-propyl-3-methylbutoxy group, 1-isopropyl-1-methylbutoxy group, 1-isopropyl-2-methylbutoxy group, 1-isopropyl-3-methylbutoxy group, 1,1-diethylbutoxy group, 1,2-diethylbutoxy group, 1-ethyl-1,2-dimethylbutoxy group, 1-ethyl-1,3-dimethylbutoxy group, 1-ethyl-2,3-dimethylbutoxy group, 2-ethyl-1,1-dimethylbutoxy group, 2-ethyl-1,2-dimethylbutoxy group, 2-ethyl-1,3-dimethylbutoxy group, 2-ethyl-2,3-dimethylbutoxy group, 1,2-dimethylcyclohexyloxy group, 1,3- dimethylcyclohexyloxy group, 1,4-dimethylcyclohexyloxy group, ethylcyclohexyloxy groups, n-nonyloxy group, 3,5,5-trimethylhexyloxy group, n-decyloxy group, n-undecyloxy group, n-dodecyloxy group, 1-adamantyloxy group, n-pentadecanyloxy group, icosanyloxy group and 10-(4-t-butylcyclohexyl)decyloxy group;

alkoxy groups substituted by an alkoxy group and having 2 to 20 carbon atoms such as a methoxymethoxy group, methoxyethoxy group, ethoxyethoxy group, n-propoxyethoxy group, isopropoxyethoxy group, n-butoxyethoxy group, isobutoxyethoxy group, tert-butoxyethoxy group, sec-butoxyethoxy group, n-pentyloxyethoxy group, isopentyloxyethoxy group, tert-pentyloxyethoxy group, sec-pentyloxyethoxy group, cyclopentyloxyethoxy group, n-hexyloxyethoxy group, ethylcyclohexyloxyethoxy group, n-nonyloxyethoxy group, 3,5,5-trimethylhexyloxyethoxy group, n-decyloxyethoxy group, n-undecyloxyethoxy group, n-dodecyloxyethoxy group, n-pentadecanyloxyethoxy group, octadecanoxyethoxy group, 3-methoxypropoxy group, 3-ethoxypropoxy group, 3-(n-propoxy)propoxy group, 2-isopropoxypropoxy group, 2-methoxybutoxy group, 2-ethoxybutoxy group, 2-(n-propoxy)butoxy group, 4-isopropoxybutoxy group, decalyloxyethoxy group and adamantyloxyethoxy group;

straight chain, branched and cyclic alkoxy groups substituted by an alkoxyalkoxy group and having 3 to 20 carbon atoms such as a methoxymethoxymethoxy group, ethoxymethoxymethoxy group, propoxymethoxymethoxy group, butoxymethoxymethoxy group, methoxyethoxymethoxy group, ethoxyethoxymethoxy group, propoxyethoxymethoxy group, butoxyethoxymethoxy group, methoxypropoxymethoxy group, ethoxypropoxymethoxy group, propoxypropoxymethoxy group, butoxypropoxymethoxy group, methoxybutoxymethoxy group, ethoxybutoxymethoxy group, propoxybutoxymethoxy group, butoxybutoxymethoxy group, methoxymethoxyethoxy group, ethoxymethoxyethoxy group, propoxymethoxyethoxy group, butoxymethoxyethoxy group, methoxyethoxyethoxy group, ethoxyethoxyethoxy group, propoxyethoxyethoxy group, butoxyethoxyethoxy group, methoxypropoxyethoxy group, ethoxypropoxyethoxy group, propoxypropoxyethoxy group, butoxypropoxyethoxy group, methoxybutoxyethoxy group, ethoxybutoxyethoxy group, propoxybutoxyethoxy group, butoxybutoxyethoxy group, methoxymethoxypropoxy group, ethoxymethoxypropoxy group, propoxymethoxypropoxy group, butoxymethoxypropoxy group, methoxyethoxypropoxy group, ethoxyethoxypropoxy group, propoxyethoxypropoxy group, butoxyethoxypropoxy group, methoxypropoxypropoxy group, ethoxypropoxypropoxy group, propoxypropoxypropoxy group, butoxypropoxypropoxy group, methoxybutoxypropoxy group, ethoxybutoxypropoxy group, propoxybutoxypropoxy group, butoxybutoxypropoxy group, methoxymethoxybutoxy group, ethoxymethoxybutoxy group, propoxymethoxybutoxy group, butoxymethoxybutoxy group, methoxyethoxybutoxy group, ethoxyethoxybutoxy group, propoxyethoxybutoxy group, butoxyethoxybutoxy group, methoxypropoxybutoxy group, ethoxypropoxybutoxy group, propoxypropoxybutoxy group, butoxypropoxybutoxy group, methoxybutoxybutoxy group, ethoxybutoxybutoxy group, propoxybutoxybutoxy group, butoxybutoxybutoxy group, 4-ethylcyclohexyloxyethoxyethoxy group, (2-ethyl-1-hexyloxy)ethoxypropoxy group, 4-(3,5,5-trimethylhexyloxy)butoxyethoxy group and 6-{2-(2-decalyloxy)butoxy}n-hexyloxy group;

alkoxy groups substituted by an alkylthio group and having 2 to 20 carbon atoms such as a methylthiomethoxy group, 2-methylthioethoxy group, 2-ethylthioethoxy group, 2-n-propylthioethoxy group, 2-isopropylthioethoxy group, 2-n-butylthioethoxy group, 2-isobutylthioethoxy group and decylthiodecyloxy group;

alkoxy groups substituted by a dialkylamino group and having 3 to 20 carbon atoms such as a dimethylaminomethoxy group, 2-dimethylaminoethoxy group, 4-dimethylaminobutoxy group, 1-dimethylaminopropan-2-yloxy group, 3-dimethylaminopropoxy group, 2-dimethylamino-2-methylpropoxy group, 2-diethylaminoethoxy group, 3-diethylaminopropoxy group, 1-diethylaminopropoxy group, 2-diisopropylaminoethoxy group, 2-(di-n-butylamino)ethoxy group, 2-piperidylethoxy group and 4-(di-n-octylamino)butoxy group; and alkoxy groups substituted by a dialkylaminoalkoxy group and having 4 to 20 carbon atoms such as a dimethylaminomethoxymethoxy group, dimethylaminoethoxyethoxy group, dimethylaminoethoxypropoxy group, diethylaminoethoxypropoxy group, 2-(2-dimethylaminoethoxy)ethoxy group, 2-(2-diethylaminoethoxy)ethoxy group and 4-(4'-diisobutylaminocyclohexyloxy)cyclohexyloxy group.

Examples of the aralkyl groups having 7 to 20 carbon atoms which are represented by $R_1$, $R_2$, $R_3$, $R_5$, $R_6$ and $R_7$ and which may have a substituent include a benzyl group, phenethyl group, 3-phenylpropyl group, 1-naphthylmethyl group, 2-naphthylmethyl group, 2-naphthylethyl group, biphenylmethyl group, 2-anthraquinoylmethyl group, 4-ethylphenylmethyl group, 4-isopropylphenylmethyl group, 4-t-butylphenylmethyl group, 4-isopropylphenylethyl group, t-butylphenylethyl group, 4-t-butylphenylethyl group, tolylmethyl group, tolylethyl group, 2,3-dimethylphenylmethyl group, 2,4-dimethylphenylmethyl group, 2,5-dimethylphenylmethyl group, 2,6-dimethylphenylmethyl group, 2,4,6-trimethylphenylmethyl group, 2-chlorophenylmethyl group, 3-chlorophenylmethyl group, 4-chlorophenylmethyl group, 2-bromophenylmethyl group, 3-bromophenylmethyl group, 4-bromophenylmethyl group, 2-fluorophenylmethyl group, 3-fluorophenylmethyl group, 4-fluorophenylmethyl group, 2-methoxyphenylmethyl group, 3-methoxyphenylmethyl group, 4-methoxyphenylmethyl group, 2-ethoxyphenylmethyl group, 3-ethoxyphenylmethyl group, 4-ethoxyphenylmethyl group, 2-n-propoxyphenylmethyl group, 3-n-propoxyphenylmethyl group, 4-n-propoxyphenylmethyl group, 2-isopropoxyphenylmethyl group, 3-isopropoxyphenylmethyl group, 4-isopropoxyphenylmethyl group, 2-n-butoxyphenylmethyl group, 3-n-butoxyphenylmethyl group, 4-n-butoxyphenylmethyl group, 2-isobutoxyphenylmethyl group, 3-isobutoxyphenylmethyl group, 4-isobutoxyphenylmethyl group, 2-t-butoxyphenylmethyl group, 3-t-butoxyphenylmethyl group, 4-t-butoxyphenylmethyl group, 2,3-dimethylphenylethyl group, 2,4-dimethylphenylethyl group, 2,5-dimethylphenylethyl group, 2,6-dimethylphenylethyl group, 2,4,6-trimethylphenylethyl group, 2-chlorophenylethyl group, 3-chlorophenylethyl group, 4-chlorophenylethyl group, 2-bromophenylethyl group, 3-bromophenylethyl group, 4

-bromophenylethyl group, 2-fluorophenylethyl group, 3-fluorophenylethyl group, 4-fluorophenylethyl group, 2-methoxyphenylethyl group, 3-methoxyphenylethyl group, 4-methoxyphenylethyl group, 2-ethoxyphenylethyl group, 3-ethoxyphenylethyl group, 4-ethoxyphenylethyl group, 2-n-propoxyphenylethyl group, 3-n-propoxyphenylethyl group, 4-n-propoxyphenylethyl group, 2-isopropoxyphenylethyl group, 3-isopropoxyphenylethyl group, 4-isopropoxyphenylethyl group, 2-n-butoxyphenylethyl group, 3-n-butoxyphenylethyl group, 4-n-butoxyphenylethyl group, 2-isobutoxyphenylethyl group, 3-isobutoxyphenylethyl group, 4-isobutoxyphenylethyl group, 2-t-butoxyphenylethyl group, 3-t-butoxyphenylethyl group, 4-t-butoxyphenylethyl group, fluoren-9-yl group, 9-methylfluoren-9-yl group, 9-ethylfluoren-9-yl group, 9-propylfluoren-9-yl group and 9-butylfluoren-9-yl group.

Examples of the aralkyloxy groups having 7 to 20 carbon atoms which are represented by $R_1$, $R_2$, $R_3$, $R_5$, $R_6$ and $R_7$ and which may have a substituent include a benzyloxy group, phenethyloxy group, 3-phenylpropoxy group, 1-naphthylmethoxy group, 2-naphthylmethoxy group, 1-naphthylethoxy group, 2-naphthylethoxy group, biphenylmethoxy group, 2-anthraquinoylmethoxy group, 4-ethylphenylmethoxy group, 4-isopropylphenylmethoxy group, 4-t-butylphenylmethoxy group, 4-isopropylphenylethoxy group, t-butylphenylethoxy group, 4-t-butylphenylethoxy group, tolylmethoxy group, tolylethoxy group, 2,3-dimethylphenylmethoxy group, 2,4-dimethylphenylmethoxy group, 2,5-dimethylphenylmethoxy group, 2,6-dimethylphenylmethoxy group, 2,4,6-trimethylphenylmethoxy group, 2-chlorophenylmethoxy group, 3-chlorophenylmethoxy group, 4-chlorophenylmethoxy group, 2-bromophenylmethoxy group, 3-bromophenylmethoxy group, 4-bromophenylmethoxy group, 2-fluorophenylmethoxy group, 3-fluorophenylmethoxy group, 4-fluorophenylmethoxy group, 2-methoxyphenylmethoxy group, 3-methoxyphenylmethoxy group, 4-methoxyphenylmethoxy group, 2-ethoxyphenylmethoxy group, 3-ethoxyphenylmethoxy group, 4-ethoxyphenylmethoxy group, 2-n-propoxyphenylmethoxy group, 3-n-propoxyphenylmethoxy group, 4-n-propoxyphenylmethoxy group, 2-isopropoxyphenylmethoxy group, 3-isopropoxyphenylmethoxy group, 4-isopropoxyphenylmethoxy group, 2-n-butoxyphenylmethoxy group, 3-n-butoxyphenylmethoxy group, 4-n-butoxyphenylmethoxy group, 2-isobutoxyphenylmethoxy group, 3-isobutoxyphenylmethoxy group, 4-isobutoxyphenylmethoxy group, 2-t-butoxyphenylmethoxy group, 3-t-butoxyphenylmethoxy group, 4-t-butoxyphenylmethoxy group, 2,3-dimethylphenylethoxy group, 2,4-dimethylphenylethoxy group, 2,5-dimethylphenylethoxy group, 2,6-dimethylphenylethoxy group, 2,4,6-trimethylphenylethoxy group, 2-chlorophenylethoxy group, 3-chlorophenylethoxy group, 4-chlorophenylethoxy group, 2-bromophenylethoxy group, 3-bromophenylethoxy group, 4-bromophenylethoxy group, 2-fluorophenylethoxy group, 3-fluorophenylethoxy group, 4-fluorophenylethoxy group, 2-methoxyphenylethoxy group, 3-methoxyphenylethoxy group, 4-methoxyphenylethoxy group, 2-ethoxyphenylethoxy group, 3-ethoxyphenylethoxy group, 4-ethoxyphenylethoxy group, 2-n-propoxyphenylethoxy group, 3-n-propoxyphenylethoxy group, 4-n-propoxyphenylethoxy group, 2-isopropoxyphenylethoxy group, 3-isopropoxyphenylethoxy group, 4-isopropoxyphenylethoxy group, 2-n-butoxyphenylethoxy group, 3-n-butoxyphenylethoxy group, 4-n-butoxyphenylethoxy group, 2-isobutoxyphenylethoxy group, 3-isobutoxyphenylethoxy group, 4-isobutoxyphenylethoxy group, 2-t-butoxyphenylethoxy group, 3-t-butoxyphenylethoxy group, 4-t-butoxyphenylethoxy group, fluoren-9-yloxy group, 9-methylfluoren-9-yloxy group, 9-ethylfluoren-9-yloxy group, 9-propylfluoren-9-yloxy group, 9-butylfluoren-9-yloxy group, 4-nitrobenzyloxy group, 4-cyanobenzyloxy group, 4-acetylbenzyloxy group, 2,4-dimethylbenzyloxy group, 2,3-dimethylbenzyloxy group, 2,5-dimethylbenzyloxy group, 2,6-dimethylbenzyloxy group, 3,5-dimethylbenzyloxy group and 2,4,6-trimethylbenzyloxy group.

Examples of the alkylthio groups which are represented by $R_1$, $R_2$, $R_3$, $R_5$, $R_6$ and $R_7$ and which may have a substituent or substituents include straight chain, branched and cyclic unsubstituted alkylthio groups having 1 to 20 carbon atoms such as a methylthio group, ethylthio group, n-propylthio group, isopropylthio group, n-butylthio group, isobutylthio group, sec-butylthio group, t-butylthio group, n-pentylthio group, isopentylthio group, 1,2-dimethylpropylthio group, 1,1-dimethylpropylthio group, cyclohexylthio group, icosanylthio group and 4-(t-butylcyclohexyl)decylthio group;

alkylthio groups substituted by an alkoxy group and having 2 to 20 carbon atoms such as a methoxymethylthio group, methoxyethylthio group, ethoxyethylthio group and 10-(2-decalinoxy)decylthio group;

alkylthio groups substituted by an alkylthio group and having 2 to 20 carbon atoms such as a methylthiomethylthio group, methylthioethylthio group, ethylthioethylthio group and 10-(2-decalinethio)decylthio group; and alkylthio groups substituted by a dialkylamino group and having 3 to 20 carbon atoms such as a 2-dimethylaminoethylthio group, 4-dimethylaminobutylthio group, 2-(di-n-butylamino)ethylthio group, 2-piperidylethylthio group and 4-(di-n-octylamino)butylthio group.

Examples of the aryl groups having 6 to 20 carbon atoms which are represented by $R_1$, $R_2$, $R_3$, $R_5$, $R_6$ and $R_7$ and which may have a substituent or substituents include unsubstituted aryl groups such as a phenyl group, naphthyl groups, anthranyl groups, fluoranthenyl groups, pyrenyl groups, perillenyl groups, triphenylenyl groups and phenanthrenyl groups;

aryl groups substituted by one or more alkyl groups and having 7 to 20 carbon atoms such as a 2-methylphenyl group, 3-methylphenyl group, 4-methylphenyl group, 2,3-dimethylphenyl group, 2,4-dimethylphenyl group, 2,5-dimethylphenyl group, 2,6-dimethylphenyl group, 3,4-dimethylphenyl group, 3,5-dimethylphenyl group, 3,6-dimethylphenyl group, 2,3,4-trimethylphenyl group, 2,3,5-trimethylphenyl group, 2,3,6-trimethylphenyl group, 2,4,5-trimethylphenyl group, 2,4,6-trimethylphenyl group, 3,4,5-trimethylphenyl group, 2-ethylphenyl group, propylphenyl groups, butylphenyl groups, hexylphenyl groups, cyclohexylphenyl groups, octylphenyl groups, 2-methyl-1-naphthyl group, 3-methyl-1-naphthyl group, 4-methyl-1-naphthyl group, 5-methyl-1-naphthyl group, 6-methyl-1-naphthyl group, 7-methyl-1-naphthyl group, 8-methyl-1-naphthyl group, 1-methyl-2-naphthyl group, 3-methyl-2-naphthyl group, 4-methyl-2-naphthyl group, 5-methyl-2-naphthyl group, 6-methyl-2-naphthyl group, 7-methyl-2-naphthyl group, 8-methyl-2-naphthyl group, 2-ethyl-2-naphthyl group and n-decylnaphthyl groups;

aryl groups substituted by one or more alkoxy groups and having 7 to 20 carbon atoms such as a 3-methoxyphenyl group, 4-methoxyphenyl group, 2,3-dimethoxyphenyl group, 2,4-dimethoxyphenyl group, 2,5-dimethoxyphenyl group, 2,6-dimethoxyphenyl group, 3,4-dimethoxyphenyl group, 3,5-dimethoxyphenyl group, 3,6-dimethoxyphenyl group, 2,3,4-trimethoxyphenyl group, 2,3,5-trimethoxyphenyl group, 2,3,6-trimethoxyphenyl group, 2,4,5-trimethoxyphenyl group, 2,4,6-trimethoxyphenyl group, 3,4,5-trimethoxyphenyl group, 2-ethoxyphenyl group, propoxyphenyl groups, butoxyphenyl groups, hexyloxyphenyl groups, cyclohexyloxyphenyl groups, octyloxyphenyl groups, 2-methoxy-1-naphthyl group, 3-methoxy-1-naphthyl group, 4-methoxy-1-naphthyl group, 5-methoxy-1-naphthyl group, 6-methoxy-1-naphthyl group, 7-methoxy-1-naphthyl group, 8-methoxy-1-naphthyl group, 1-methoxy-2-naphthyl group, 3-methoxy-2-naphthyl group, 4-methoxy-2-naphthyl group, 5-methoxy-2-naphthyl group, 6-methoxy-2-naphthyl group, 7-methoxy-2-naphthyl group, 8-methoxy-2-naphthyl group, 2-ethoxy-1-naphthyl group and decalinoxynaphthyl groups;

aryl groups substituted by one or more halogen atoms and having 6 to 20 carbon atoms such as chlorophenyl groups, dichlorophenyl groups, trichlorophenyl groups, bromophenyl groups, dibromophenyl groups, iodophenyl groups, fluorophenyl groups, difluorophenyl groups, trifluorophenyl groups, tetrafluorophenyl group, pentafluorophenyl group, trifuoromethylphenyl groups and 6-(perfluorodecyloxy)naphthyl group;

aryl groups substituted by an N-monoalkyl- or N-monoarylamino group and having 7 to 20 carbon atoms such as an N-methylaminophenyl group, N-ethylaminophenyl group, N-decylnaphthyl group, N-phenylaminophenyl group and N-tolylaminophenyl group;

aryl groups substituted by an N,N-dialkylamino group, an N,N-diarylamino group or an N-aryl-N-alkylamino group and having 8 to 20 carbon atoms such as an N,N-dimethylaminophenyl group, N,N-diethylaminophenyl group, N-phenyl-N-methylaminophenyl group, N-tolyl-N-ethylaminophenyl group, N-chlorophenyl-N-cyclohexylaminophenyl group and N,N-ditolylaminophenyl group;

aryl groups substituted by an alkylthio group and having 7 to 20 carbon atoms such as methylthiophenyl groups, ethylthiophenyl groups, methylthionaphthyl groups and decylthionaphthyl groups; and aryl groups substituted by an arylthio group and having 12 to 20 carbon atoms such as phenylthiophenyl groups and naphthylthionaphthyl groups.

Examples of the aryloxy groups having 6 to 20 carbon atoms which are represented by $R_1$, $R_2$, $R_3$, $R_5$, $R_6$ and $R_7$ and which may have a substituent or substituents include unsubstituted aryloxy groups having 6 to 20 carbon atoms such as a phenoxy group, naphthyloxy groups, anthranyloxy groups, fluoranthenyloxy groups, pyrenyloxy groups, perilenyloxy groups, triphenylenyloxy groups and phenanthrenyloxy groups;

aryloxy groups substituted by one or more alkyl groups and having 7 to 20 carbon atoms such as a 2-methylphenyloxy group, 3-methylphenyloxy group, 4-methylphenyloxy group, 2,3-dimethylphenyloxy group, 2,4-dimethylphenyloxy group, 2,5-dimethylphenyloxy group, 2,6-dimethylphenyloxy group, 3,4-dimethylphenyloxy group, 3,5-dimethylphenyloxy group, 3,6-dimethylphenyloxy group, 2,3,4-trimethylphenyloxy group, 2,3,5-trimethylphenyloxy group, 2,3,6-trimethylphenyloxy group, 2,4,5-trimethylphenyloxy group, 2,4,6-trimethylphenyloxy group, 3,4,5-trimethylphenyloxy group, 2-ethylphenyloxy group, propylphenyloxy groups, butylphenyloxy groups, hexylphenyloxy groups, cyclohexylphenyloxy groups, octylphenyloxy groups, 2-methyl-1-naphthyloxy group, 3-methyl-1-naphthyloxy group, 4-methyl-1-naphthyloxy group, 5-methyl-1-naphthyloxy group, 6-methyl-1-naphthyloxy group, 7-methyl-1-naphthyloxy group, 8-methyl-1-naphthyloxy group, 1-methyl-2-naphthyloxy group, 3-methyl-2-naphthyloxy group, 4-methyl-2-naphthyloxy group, 5-methyl-2-naphthyloxy group, 6-methyl-2-naphthyloxy group, 7-methyl-2-naphthyloxy group, 8-methyl-2-naphthyloxy group and 2-ethyl-1-naphthyloxy group;

aryloxy groups substituted by one or more alkoxy groups and having 7 to 20 carbon atoms such as a 3-methoxyphenyloxy group, 4-methoxyphenyloxy group, 2,3-dimethoxyphenyloxy group, 2,4-dimethoxyphenyloxy group, 2,5-dimethoxyphenyloxy group, 2,6-dimethoxyphenyloxy group, 3,4-dimethoxyphenyloxy group, 3,5-dimethoxyphenyloxy group, 3,6-dimethoxyphenyloxy group, 2,3,4-trimethoxyphenyloxy group, 2,3,5-trimethoxyphenyloxy group, 2,3,6-trimethoxyphenyloxy group, 2,4,5-trimethoxyphenyloxy group, 2,4,6-trimethoxyphenyloxy group, 3,4,5-trimethoxyphenyloxy group, 2-ethoxyphenyloxy group, propoxyphenyloxy groups, butoxyphenyloxy groups, hexyloxyphenyloxy groups, cyclohexyloxyphenyloxy groups, octyloxyphenyloxy groups, 2-methoxy-1-naphthyloxy group, 3-methoxy-1-naphthyloxy group, 4-methoxy-1-naphthyloxy group, 5-methoxy-1-naphthyloxy group, 6-methoxy-1-naphthyloxy group, 7-methoxy-1-naphthyloxy group, 8-methoxy-1-naphthyloxy group, 1-methoxy-2-naphthyloxy group, 3-methoxy-2-naphthyloxy group, 4-methoxy-2-naphthyloxy group, 5-methoxy-2-naphthyloxy group, 6-methoxy-2-naphthyloxy group, 7-methoxy-2-naphthyloxy group, 8-methoxy-2-naphthyloxy group and 2-ethoxy-1-naphthyloxy group;

aryloxy groups substituted by one or more halogen atoms and having 6 to 20 carbon atoms such as chlorophenyloxy groups, dichlorophenyloxy groups, trichlorophenyloxy groups, bromophenyloxy groups, dibromophenyloxy groups, iodophenyloxy groups, fluorophenyloxy groups, difluorophenyloxy groups, trifluorophenyloxy groups, tetrafluorophenyloxy group, pentafluorophenyloxy group, trifluoromethylphenyloxy groups and 6-(perfluorodecyloxy)naphthyloxy group;

aryloxy groups substituted by an N-monoalkyl- or N-monoarylamino group and having 7 to 20 carbon atoms such as N-methylaminophenoxy groups, N-ethylaminophenoxy groups, N-decylnaphthoxy groups, N-phenylaminophenoxy groups and N-tolylaminophenoxy groups;

aryloxy groups substituted by an N,N-dialkylamino group, an N,N-diarylamino group or an N-aryl-N-alkylamino group and having 8 to 20 carbon atoms such as N,N-dimethylaminophenoxy groups, N,N-diethylaminophenoxy groups, N-phenyl-N-methylaminophenoxy groups, N-tolyl-N-ethylaminophenoxy groups, N-chlorophenyl-N-cyclohexylaminophenoxy groups and N,N-ditolylaminophenoxy groups;

aryloxy groups substituted by an alkylthio group and having 7 to 20 carbon atoms such as methylthiophenoxy groups, ethylthiophenoxy groups, methylthionaphthoxy groups and decylthionaphthoxy groups; and aryloxy groups substituted by an arylthio group and having 12 to 20 carbon atoms such as phenylthiophenoxy groups and naphthylthionaphthoxy groups.

Examples of the arylthio groups having 6 to 20 carbon atoms which are represented by $R_1$, $R_2$, $R_3$, $R_5$, $R_6$ and $R_7$ and which may have a substituent or substituents include a phenylthio group, 2-methylphenylthio group, 4-methylphenylthio group, 4-t-butylphenylthio group, 2-methoxyphenylthio group, 4-t-butylphenylthio group and pyrenylthio group.

Examples of the heteroaryl groups having 2 to 20 carbon atoms which are represented by $R_1$, $R_2$, $R_3$, $R_5$, $R_6$ and $R_7$ and which may have a substituent or substituents include pyrrolyl groups, N-methylpyrrolyl groups, N-ethylpyrrolyl groups, N-propylpyrrolyl groups, N-butylpyrrolyl groups, N-isobutylpyrrolyl groups, N-isopentylpyrrolyl groups, N-octrylpyrrolyl groups, N-methoxymethylpyrrolyl groups, N-methoxyethylpyrrolyl groups, N-ethoxymethylpyrrolyl groups, N-ethoxyethylpyrrolyl groups, N-methoxycarbonylmethylpyrrolyl groups, N-methoxycarbonylethylpyrrolyl groups, N-ethoxycarbonylmethylpyrrolyl groups, N-ethoxycarbonylethylpyrrolyl groups, N-benzylpyrrolyl groups, N-phenylpyrrolyl groups, N-tolylpyrrolyl groups, N-allylpyrrolyl groups, N-butenylpyrrolyl groups, N-pentenylpyrrolyl groups, N-hexadecylpyrrolyl groups, thienyl groups, furyl groups, pyridyl groups, quinolyl groups, isoquinolyl groups, oxazoyl groups, isooxazoyl groups, oxadiazoyl groups, thiadiazoyl groups, imidazoyl groups, benzothiazoyl groups, benzoxazoyl groups, benzoimidazoyl groups, benzofuryl groups and indol-3-yl group.

Examples of the alkenyl groups having 2 to 10 carbon atoms which are represented by $R_1$, $R_2$, $R_3$, $R_5$, $R_6$ and $R_7$ and which may have a substituent or substituents include a vinyl group, 1-propenyl group, 2-propenyl group, 1-butenyl group, 1-pentenyl group, 2-pentenyl group, 3-methyl-1-butenyl group, 2,2-dicyanovinyl group and 1,2,2-tricyanovinyl group.

Typical examples of a substituent Q in formula (3)

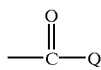

(3)

which is represented by $R_1$, $R_2$, $R_3$, $R_5$, $R_6$ and $R_7$ include a hydrogen atom;

the above-mentioned alkyl groups;
the above-mentioned alkoxy groups;
the above-mentioned aralkyl groups;
the above-mentioned aralkyloxy groups;
the above-mentioned aryl groups;

the above-mentioned aryloxy groups;

alkenyloxy groups having 2 to 10 carbon atoms such as an allyloxy group and a 2-butenoxy group;

amino groups;

unsubstituted monoalkylamino groups having 1 to 10 carbon atoms such as a methylamino group, n-butylamino group, n-hexylamino group, cyclohexylamino group, 4-methylcyclohexylamino group, 2-ethylhexylamino group and 3,5,5-trimethylhexylamino group;

monoalkylamino groups substituted by a hydroxyl group and having 1 to 10 carbon atoms such as a hydroxyethylamino group, 2-hydroxypropylamino group and 3-hydroxypropylamino group;

monoalkylamino groups substituted by an alkoxy group and having 2 to 10 carbon atoms such as a methoxymethylamino group, methoxyethylamino group, ethoxymethylamino group, ethoxyethylamino group, propoxyethylamino group and 2-(2'-ethylhexyloxy) ethylamino group;

unsubstituted dialkylamino groups having 2 to 20 carbon atoms such as a dimethylamino group, diethylamino group, di-n-butylamino group, di-n-hexylamino group, di-n-octylamino group, di-n-decylamino group, N-isoamyl-N-methylamino group and piperidino group;

hydroxyl-substituted dialkylamino groups having 2 to 20 carbon atoms such as a di(hydroxyethyl)amino group, di(2-hydroxypropyl)amino group, di(3-hydroxypropyl) amino group and di(10-hydroxydecyl)amino group;

alkoxy-substituted dialkylamino groups having 4 to 20 carbon atoms such as a di(methoxymethyl)amino group, di(methoxyethyl)amino group, di(ethoxymethyl)amino group, di(ethoxyethyl)amino group, di(propoxyethyl)amino group, di(butoxyethyl) amino group and bis[2-(2'-ethylhexyloxy)ethyl]amino group;

arylamino groups having 6 to 10 carbon atoms such as a phenylamino group, 4-methylphenylamino group, 2-methoxyphenylamino group, 4-n-propylphenylamino group and 4-t-butoxyphenylamino group;

alkoxycarbonylalkoxy groups having 3 to 10 carbon atoms such as a methoxycarbonylmethoxy group, ethoxycarbonylmethoxy group, n-propoxycarbonylmethoxy group, isopropoxycarbonylmethoxy group and 41-ethylcyclohexyloxycarbonylmethoxy group; and alkylcarbonylalkoxy groups having 3 to 10 carbon atoms such as a methylcarbonylmethoxy group, ethylcarbonylmethoxy group and octylcarbonylmethoxy group.

Typical examples of a substituent L in formula (4)

—NH—L (4)

which is represented by $R_1$, $R_2$, $R_3$, $R_5$, $R_6$ and $R_7$ include a hydrogen atom;

unsubstituted alkylcarbonyl groups having 2 to 10 carbon atoms such as an acetyl group, ethylcarbonyl group, isobutylcarbonyl group, cyclohexylcarbonyl group and 3,5,5-trimethylhexylcarbonyl group;

alkylcarbonyl groups substituted by one or more halogen atoms and having 2 to 10 carbon atoms such as a chloroacetyl group, 2,2,2-trifluoroacetyl group and perfluorodecanoyl group;

alkylcarbonyl groups substituted by an alkoxy group and having 3 to 10 carbon atoms such as a methoxyacetyl group, methoxypropionyl group and 4-t-butoxycyclohexylcarbonyl group; and arylcarbonyl groups having 7 to 15 carbon atoms such as a phenylcarbonyl group, 4-phenylphenylcarbonyl group, 2-naphthylcarbonyl group, 4-ethylphenylcarbonyl group, 3-isopropylphenylcarbonyl group, 2-methoxyphenylcarbonyl group, N,N-dimethylaminophenylcarbonyl group, 3-phenoxyphenylcarbonyl group and 3-butoxynaphthylcarbonyl group.

Typical examples of a substituent $R_4$ of a compound represented by formula (2) or (5) regarding the present invention include a hydrogen atom; cyano group;

the above-mentioned alkyl groups;

the above-mentioned aralkyl groups;

the above-mentioned aryl groups;

the above-mentioned heteroaryl groups; and the above-mentioned alkenyl groups.

Typical examples of substituents $Z_1$ and $Z_2$ of a compound represented by formula (2) or (5) regarding the present invention include a hydrogen atom; cyano group;

the above-mentioned halogen atoms;

the above-mentioned alkyl groups;

the above-mentioned aralkyl groups;

the above-mentioned alkoxy groups;

the above-mentioned aralkyloxy groups;

the above-mentioned alkylthio groups;

the above-mentioned aryl groups;

the above-mentioned aryloxy groups;

the above-mentioned arylthio groups;

the above-mentioned heteroaryl groups;

heteroaryloxy groups having 2 to 20 carbon atoms such as pyrrolyloxy groups, N-methyl-2,3-dimethylpyrrolyl-4-oxy group, N-butyl-2,3-dimethylpyrrolyl-4-oxy group, thienyloxy groups, furanyloxy groups, oxazoyloxy groups and 1,2,3-thiadiazolyl-4-oxy group; and heteroarylthio groups having 2 to 20 carbon atoms such as pyrrolylthio groups, 1-methylimidazolyl-2-thio group, 1-benzyimidazolyl-2-thio group, thienylthio groups, furanylthio groups, oxazoylthio groups and tirazolylthio groups.

Table 1 shows typical examples of the dipyrromethene boron complex compounds represented by formula (1), but the scope of the present invention should not be limited to these compounds alone.

TABLE 1

| Compound | $R_1$ | $R_2$ | $R_3$ | $R_4$ | $R_5$ |
|---|---|---|---|---|---|
| 1-1 | —CH$_3$ | —C$_2$H$_5$ | —CH$_3$ | H | —CH$_3$ |
| 1-2 | —CH$_3$ | H | —CH$_3$ | —CH$_3$ | —C$_2$H$_5$ |
| 1-3 | —C$_2$H$_5$ | -i-C$_4$H$_9$ | —C$_2$H$_5$ | -p-C$_6$H$_4$CH$_3$ | —C$_2$H$_5$ |
| 1-4 | —CH$_3$ | —C$_2$H$_5$ | —CH$_3$ | -m-C$_6$H$_4$CF$_3$ | —CH$_3$ |
| 1-5 | —CH$_3$ | —C$_2$H$_5$ | —CH$_3$ | —CN | —CH$_3$ |
| 1-6 | H | —CF$_3$ | —CH$_3$ | H | —CH$_3$ |
| 1-7 | —CH$_3$ | —C$_2$H$_5$ | —C$_2$H$_4$OCH$_3$ | -p-C$_6$H$_4$OCH$_3$ | —C$_2$H$_4$OH |
| 1-8 | —CH$_3$ | Br | —CH$_3$ | —CH$_2$C$_6$H$_5$ | —CH$_3$ |
| 1-9 | —CH$_3$ | —C$_2$H$_5$ | —CH$_3$ | —C$_2$H$_5$ | H |
| 1-10 | —CH$_3$ | H | -n-C$_6$H$_{13}$ | H | -n-C$_6$H$_{13}$ |

| Compound | $R_6$ | $R_7$ | $Z_1$ | $Z_2$ |
|---|---|---|---|---|
| 1-1 | —C$_2$H$_5$ | —CH$_3$ | —OCH$_3$ | —OCH$_3$ |
| 1-2 | H | —CH$_3$ | —OC$_2$H$_5$ | —OC$_2$H$_5$ |
| 1-3 | -i-C$_4$H$_9$ | —C$_2$H$_5$ | —O-i-C$_4$H$_9$ | —O-i-C$_4$H$_9$ |
| 1-4 | -n-C$_4$H$_9$ | —CH$_3$ | —O-i-C$_3$H$_7$ | —O-i-C$_3$H$_7$ |
| 1-5 | H | -C$_6$H$_5$ (phenyl) | cyclohexyl-O— | cyclohexyl-O— |

TABLE 1-continued

| | | | | | |
|---|---|---|---|---|---|
| 1-6 | —CF$_3$ | H | (3-methylcyclohexyl) | —CH$_2$—O—CH$_2$CH(C$_2$H$_5$)C$_4$H$_9$ | —O—CH$_2$CH(C$_2$H$_5$)C$_4$H$_9$ |
| 1-7 | —C$_2$H$_5$ | —CH$_3$ | —CH$_3$ | —OCH(C$_2$H$_5$)$_2$ | —OCH$_3$ |
| 1-8 | Br | —CH$_3$ | —CH$_3$ | —O-n-C$_{10}$H$_{21}$ | —OCH$_3$ |
| 1-9 | H | H | (decahydronaphthyl) | (2-methoxydecahydronaphthyl) | |
| 1-10 | H | H | —CH$_3$ | —O—CH$_2$—C$_6$H$_5$ | —OCH$_3$ |

| Compound | R$_1$ | R$_2$ | R$_3$ | R$_4$ | R$_5$ |
|---|---|---|---|---|---|
| 1-11 | H | —C$_2$H$_5$ | (3-methylphenyl) | —C$_2$H$_5$ | |
| 1-12 | —CH$_3$ | H | —CH$_3$ | —CH=CH$_2$ | —CH$_3$ |
| 1-13 | —CH$_3$ | H | —CH$_3$ | —CH$_3$ | —CH$_3$ |
| 1-14 | —CH$_3$ | —CH$_3$ | —CH$_3$ | —CN | —CH$_3$ |
| 1-15 | —CH$_3$ | —CH$_3$ | —SCH$_3$ | —CH$_3$ | —SCH$_3$ |
| 1-16 | —OH | —C$_2$H$_5$ | —CH$_3$ | H | (phenyl) |
| 1-17 | —C(=O)CH$_3$ | —C$_2$H$_5$ | —C$_2$H$_5$ | H | —CH$_3$ |

TABLE 1-continued

| 1-18 | —CH₃ | —CH₃ | —CH₃ | —CONH₂ |
| 1-19 | (2-ethoxyethoxy)ethyl | benzyloxy | 4-(methylthio)phenyl | 2-methoxycyclohexyl |

| Compound | R₆ | R₇ | Z₁ | Z₂ |
|---|---|---|---|---|
| 1-11 | —C₂H₅ | H | —O-n-C₅H₁₁ | 2-methoxyethyl (phenethyl ether) |
| 1-12 | H | —CH₃ | —OC₂H₅ | 2-methoxydecahydronaphthyl |
| 1-13 | H | n-propylphenyl | 4-ethylbenzyloxy | 4-ethylbenzyloxy |
| 1-14 | —CH₃ | —CH₃ | 4-methoxycyclohexyl | —OC₂H₅ |
| 1-15 | —CH₃ | —CH₃ | 2-naphthylmethoxy | —OCH₃ |
| 1-16 | H | phenyl | —O-n-C₃H₇ | 4-isopropylbenzyloxy |

TABLE 1-continued

| | R₁ | | | |
|---|---|---|---|---|
| 1-17 | —NH₂ | —CH₃ | | —OCH₃ |
| 1-18 | —C₂H₅ | —C₂H₅ | (3-methylcyclohexyl-CH₂-O-CH₂-) | —OCH₃ |
| 1-19 | (PhCH₂-O-CH₂-CH₂-) | —CH₂N(CH₃)₂ | (4-methylphenyl) | (4-fluorophenyl) |

| Compound | R₁ | R₂ | R₃ | R₄ | R₅ |
|---|---|---|---|---|---|
| 1-20 | (5-methyloxazol-2-yl) | —CH₃ | —CH₃ | (4-chlorophenyl) | —CH₃ |
| 1-21 | —C₂H₅ | (4-tert-butylphenyl-S-CH₃) | H | (4-ethylphenyl-CH₂-) | —CH₂Cl |
| 1-22 | —CH₂OCH₃ | —CH₃ | —CH₃ | —CH=CHCH₃ | —CH₃ |
| 1-23 | —C(=O)OCH₃ | —CH₃ | —CH₃ | -n-C₅H₁₁ | —CH=CH₂ |
| 1-24 | (PhCH₂-) | —CH₃ | —CH₃ | H | —CH₃ |
| 1-25 | —CONHCH₃ | —C₂H₅ | —C₂H₅ | H | —CH₃ |

TABLE 1-continued

| Compound | R$_6$ | R$_7$ | Z$_1$ | Z$_2$ |
|---|---|---|---|---|
| 1-20 | —CH$_3$ | —CHO | benzyloxy (—OCH$_2$C$_6$H$_5$) | benzyloxy (—OCH$_2$C$_6$H$_5$) |
| 1-21 | H | —CH$_3$ | cyclohexyl-CH(CH$_3$)CH(OCH$_3$)— | —OCH$_3$ |
| 1-22 | —CH$_3$ | —CH$_2$OC(O)CH$_2$OC(O)CH$_3$ | (iPr)$_2$CHOCH$_3$ | —OCH$_3$ |
| 1-23 | —CH$_3$ | —CH=CH$_2$ | isopentyloxy (—OCH$_2$CH$_2$CH(CH$_3$)$_2$) | isopentyloxy (—OCH$_2$CH$_2$CH(CH$_3$)$_2$) |
| 1-24 | —CH$_3$ | —CONHCH$_2$OH | —OCH$_3$ | —O-n-C$_{20}$H$_{41}$ |
| 1-25 | —CH$_3$ | —CH$_3$ | 4-MeO-C$_6$H$_4$-CH$_2$O— | —OCH$_3$ |
| 1-26 | —OC(O)CH$_2$C$_6$H$_5$ | —CH$_3$ | —C$_2$H$_4$OC$_2$H$_5$ | H |
| 1-27 | H | —CH$_3$ | —CON(CH$_2$OH)$_2$ | tolyl |

TABLE 1-continued

| Compound | R$_1$ | R$_2$ | R$_3$ | R$_4$ | R$_5$ |
|---|---|---|---|---|---|
| 1-26 | H | | | 2-phenethoxymethyl group | |
| 1-27 | Br | | | 4-isopropylbenzyloxy group | —OCH$_3$ |

| Compound | R$_1$ | R$_2$ | R$_3$ | R$_4$ | R$_5$ |
|---|---|---|---|---|---|
| 1-28 | —CON(CH$_3$)$_2$ | H | —CH$_3$ | 2,4-dimethyl-1H-pyrrol-3-yl (Me, Me) | —CH$_3$ |
| 1-29 | CON(CH$_2$OCH$_3$)$_2$ | —CH$_3$ | —CH$_3$ | —CH=C(CN)$_2$ | —CH$_3$ |
| 1-30 | N-methylbenzamido group | —CH$_3$ | —CH(CH$_3$)$_2$ | H | —CH$_3$ |
| 1-31 | N-methylbenzamido group | —C$_2$H$_5$ | H | —CH=CHC$_2$H$_5$ | —CH$_3$ |
| 1-32 | —CH=CH$_2$ | H | H | 2-furyl | —CH$_3$ |

TABLE 1-continued

| | | | | | |
|---|---|---|---|---|---|
| 1-33 | —NHCOCF₃ | [4-(NMe₂)-phenyl O-isopropyl ether] | —CH₃OCH₂CH₂OCH₂CH₂OC₂H₅— | [4-NMe₂-tolyl] | [4-OMe-tolyl] |
| 1-34 | —CH=CHCH(CH₃)₂ | F | H | [1-Me-2-Me-pyrrolyl] | H |
| 1-35 | Cl | [n-pentyl isopropyl ether] | H | [cyclohexyl propyl ether] | —CH₃ |
| 1-36 | —CH₃ | —C₂H₅ | —CH₃ | —CH₃ | —CH₃ |

| Compound | R₆ | R₇ | Z₁ | Z₂ |
|---|---|---|---|---|
| 1-28 | H | —CONHC₂H₄OCH₃ | [phenyl-CH₂CH₂-O-methyl] | [phenyl-CH₂CH₂-O-methyl] |
| 1-29 | —CH₃ | —CH₃ | —O-n-C₃H₇ | —O-n-C₃H₇ |
| 1-30 | —CH₃ | —CH₃ | [2,3-diMe-4-OMe-1-n-C₄H₉-pyrrolyl] | —OCH₃ |
| 1-31 | —CH₃ | —CH₃ | [5-(methylthio)-2H-1,2,3-triazolyl] | —OCH₃ |

TABLE 1-continued

| Compound | | | | | |
|---|---|---|---|---|---|
| 1-32 | —CH₃ | | —NH—C(O)—Ph (acetanilide group) | —OCH₂—C₆H₅ | —OCH₃ |
| 1-33 | 4-MeO-C₆H₄-Me | | 4-Cl-C₆H₄- | 4-MeO-C₆H₄- | 4-MeS-C₆H₄- |
| 1-34 | F | | —CH=CHCH(CH₃)₂ | 4-Cl-C₆H₄-OCH₂- | 4-Cl-C₆H₄-OCH₂- |
| 1-35 | —CH₃ | | —CH₃ | 2-Me-C₆H₄-OCH₂- | 2-Me-C₆H₄-OCH₂- |
| 1-36 | —CH₃ | | —CN | 4-iPrO-C₆H₄-CH₂CH₂OCH₃ | —OCH₂CH(C₂H₅)₂ |

| Compound | R₁ | R₂ | R₃ | R₄ | R₅ |
|---|---|---|---|---|---|
| 1-37 | —CH₃ | —C₂H₅ | —CH₃ | H | —CH₃ |
| 1-38 | —CH₃ | H | 4-tBu-C₆H₄- | —C₆H₅ | —C₂H₅ |

TABLE 1-continued
| | R6 | R7 | Z1 | Z2 |
|---|---|---|---|---|
| 1-39 | —CH3 | H | H | H |
| 1-40 | —CH3 | —C2H5 | —CH3 | —CH3 |
| 1-41 | —CH3 | —C2H5 | —CH3 | —CH3 |
| 1-42 | —CH3 | —C2H5 | —CH3 | —CH3 |
| 1-43 | —CH3 | H | —CH3 | —CH3 |
| 1-44 | —CH3 | H | —CH3 | —CH=CH2 |
| 1-45 | —CH3 | —C2H5 | —CH3 | H |
Z1 structures for 1-39:  (9-methylfluorenyl); for 1-40, 1-41, 1-42: phenyl/tolyl groups
| Compound | R6 | R7 | Z1 | Z2 |
|---|---|---|---|---|
| 1-37 | —C2H5 | —CN | 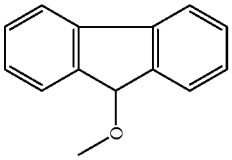 | 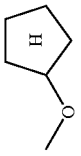 |
| 1-38 | —C2H5 | Br |  | —OCH3 |

TABLE 1-continued

| Compound | R₁ | R₂ | R₃ | R₄ | R₅ |
|---|---|---|---|---|---|
| 1-39 | H | —CH₃ | —OCH₂—C₆H₅ | | —OCH₂CH(C₂H₅)₂ |
| 1-40 | —C₂H₅ | —CH₃ | —OC₂H₅ | | —O-n-C₃H₇ |
| 1-41 | —C₂H₅ | —CH₃ | —OCH₃ | | F |
| 1-42 | —C₂H₅ | —CH₃ | —OC₂H₅ | | Cl |
| 1-43 | H | —CH₃ | 3-methoxyphenyl | | Br |
| 1-44 | H | | 3-methyl-phenoxy (3-CH₃-C₆H₄-O—) | | |
| 1-45 | H | —CH₃ | —OCH₂—C₆H₅ | | F |

| Compound | R₁ | R₂ | R₃ | R₄ | R₅ |
|---|---|---|---|---|---|
| 1-46 | —CH₃ | —C₂H₅ | —OCH₃ | H | —OCH₃ |
| 1-47 | —CH₃ | —C₂H₅ | —CH₃ | H | —OCH₂CH₂CH(CH₃)₂ |
| 1-48 | —CH₃ | —C₂H₅ | —CH₃ | H | —OC₂H₅ |
| 1-49 | —CH₃ | —C₂H₅ | —CH₃ | H | —OCH₃ |
| 1-50 | —CH₃ | —C₂H₅ | —CH₃ | —CN | —OCH₃ |
| 1-51 | —CH₃ | —C₂H₅ | —CH₃ | H | —OCH₃ |
| 1-52 | —CH₃ | —C₂H₅ | —OCH₂OCH₃ (MeOCH₂O—) | —CH₂—C₆H₅ | 2-methoxyphenoxy |
| 1-53 | —CH₃ | Br | —CH₃ | —CN | —O—C₆H₅ |

TABLE 1-continued

| Compound | R6 | R7 | Z1 | Z2 |
|---|---|---|---|---|
| 1-46 | H | H | F | F |
| 1-47 | —CH3 | H | F | —OCH3 |
| 1-48 | —OC2H5 | —CH3 | F | F |
| 1-49 | -n-C4H9 | —CH3 | —OCH3 | —OCH3 |
| 1-50 | H | (phenyl) | F | F |
| 1-51 | —CH3 | —CH3 | F | F |
| 1-52 | H | H | -n-C5H11 | -n-C5H11 |
| 1-53 | —CH3 | —CH3 | -n-C5H11 | -n-C5H11 |
| 1-54 | Br | —CH3 | (phenyl) | (phenyl) |
| 1-55 | H | —OCH3 | (phenyl) | (phenyl) |
| 1-56 | —OC2H5 | H | -n-C5H11 | -n-C5H11 |
| 1-57 | Br | —CH3 | —OC2H5 | —OC2H5 |

TABLE 1-continued

| Compound | R₁ | R₂ | R₃ | R₄ | R₅ |
|---|---|---|---|---|---|
| 1-58 | -SMe, -CH₂OCH₂CH₂SMe | -CH₂SCH₃ | | 4-NMe₂-C₆H₄- | 4-methoxy-1,2,3-thiadiazol-5-yl |
| 1-59 | -CH₃ | -OCH₃ | H | -CN | H |
| 1-60 | -OCH₃ | -OCH₃ | -CN | H | -SCH₃ |
| 1-61 | -OH | -C₂H₅ | -CH₃ | -CH=CH₂ | C₆H₅- (phenyl) |
| 1-62 | -COCH₃ | -OC₂H₅ | -OC₂H₅ | H | -CH₃ |
| 1-63 | -CO₂CH=CH₂ | -OCH₃ | -CH₃ | -CH₃ | -CONH₂ |
| 1-64 | -CH₂OCH₂OMe | H | -CH₃ | H | -CH₃ |
| 1-65 | 5-methyl-oxazol-2-yl | -CH₂OCH₂CH(CH₃)CH₂CH₃ (isopentyloxymethyl) | H | 4-CH₃-C₆H₄- | -CH₃ |
| 1-66 | -OC₂H₅ | 4-(SCH₃)-C₆H₄- | -OCH₃ | benzyl | -CH₂Cl |
| 1-67 | -OCH₂CH₂OMe | -OCH₃ | -CH₃ | -CN | -CH₃ |
| 1-68 | -CO₂CH₃ | -OCH₃ | -CH₃ | -n-C₅H₁₁ | -CH=CH₂ |

| Compound | R₆ | R₇ | Z₁ | Z₂ |
|---|---|---|---|---|
| 1-59 | -OCH₃ | -CH₃ | 2-methylthio-1-methyl-imidazol-? | F |
| 1-60 | -CH₃ | -CH₃ | F | -OCH₃ |

TABLE 1-continued

| | $R_1$ | $R_2$ | $R_3$ | | |
|---|---|---|---|---|---|
| 1-61 | —OCH$_3$ | phenyl | phenyl | phenyl | |
| 1-62 | —NH$_2$ | —CH$_3$ | —CH$_2$Cl | F | |
| 1-63 | —OC$_2$H$_5$ | —OC$_2$H$_5$ | —S-phenyl | —OCH$_3$ | |
| 1-64 | H | 2-methylpyrrole | —SCH$_3$ | —SCH$_3$ | |
| 1-65 | Cl | —CH$_3$ | —CH$_2$-phenyl | —CH$_2$-phenyl | |
| 1-66 | H | —CH$_3$ | cyclohexyl-CH(CH$_3$)CH(CH$_3$)H | cyclohexyl-CH(CH$_3$)CH(CH$_3$)H | |
| 1-67 | —CH$_3$ | —CH(CO$_2$Me)CH$_2$CO$_2$— | 2-methylpyrrole | 2-methylpyrrole | |
| 1-68 | —CH$_3$ | —CH=CH$_2$ | —OCH$_3$ | —OCH$_3$ | |

| Compound | $R_1$ | $R_2$ | $R_3$ | $R_4$ | $R_5$ |
|---|---|---|---|---|---|
| 1-69 | —CH$_2$-phenyl | | | H | —OCH$_3$ |

TABLE 1-continued

| Compound | R6 | R7 | | | |
|---|---|---|---|---|---|
| 1-70 | —CONHCH3 (with CH2-phenyl-CO2—) | —C2H5 | —C2H5 | H | —CH3 |
| 1-71 | H | —CH3 | —CH3 | H | H |
| 1-72 | —CON(CH3)2 | —OCH3 | —OCH3 | H | —OMe (—O—CH2—O—) |
| 1-73 | —CON(CH2OH)2 | H | —OCH3 | H | |
| 1-74 | —CON(CH2OCH3)2 | —CH3 | —CH3 | H3C, CH3 pyrrole (2,5-dimethyl-3-methyl-1H-pyrrole) | |
| 1-75 | —NHCOCH3 | —CH3 | —CH3 | | |
| 1-76 | NHCO-phenyl | —C2H5 | H | —CH=CH2, H | |
| 1-77 | —CH=CH2 | H | H | —CN | phenyl, —OCH3 |

| Compound | R6 | R7 | Z1 | Z2 |
|---|---|---|---|---|
| 1-69 | —OCH3 | —CONHCH2OH | F | F |
| 1-70 | —OCH3 | —CH3 | —S—CH2—CH2—S—Me | —S—CH2—CH2—S—Me |
| 1-71 | H | —CH(CO2Me)CH2CO2— | -n-C5H11 | -n-C5H11 |
| 1-72 | Br | phenyl | —S—CH2—CH2—N(CH3)2 | F |

TABLE 1-continued

| Compound | R₁ | R₂ | R₃ | R₄ | R₅ |
|---|---|---|---|---|---|
| 1-73 | H | —CONH—O—Me (ethyl linker) | —N(CH₃)₂ | | —N(CH₃)₂ |
| 1-74 | —OCH₃ | —CH₃ | 5-methyloxazol-2-yl | | 5-methyloxazol-2-yl |
| 1-75 | —CH₃ | —CH₃ | 1-(phenylmethyl)-2-(methylthio)imidazol-5-yl | | F |
| 1-76 | —CH₃ | —CH₃ | 1,2-dimethyl-4-methoxy-3-methylpyrrol-? | | —OCH₃ |
| 1-77 | —CH₃ | —CH₃ | —OCH₂—S—Me (via CH₂OCH₂SMe) | | —OCH₂—S—Me |
|  |  | CONH-phenyl |  |  |  |

| Compound | R₁ | R₂ | R₃ | R₄ | R₅ |
|---|---|---|---|---|---|
| 1-78 | H | —CO₂-phenyl | —OCH₃ | H | —OCH₃ |
| 1-79 | —CH=CH₂ | Br | H | H | —OC₂H₅ |
| 1-80 | —CH₃ | Cl | —OCH₂—O—Me | —CN | —OCH₂—O—OMe |
| 1-81 | —CH₃ | —C₂H₅ | —CH₃ | H | —OCH₃ |
| 1-82 | —CH₃ | —C₂H₅ | —CH₃ | H | —OCH₃ |

TABLE 1-continued
| Compound | R6 | R7 | Z1 | | Z2 | |
|---|---|---|---|---|---|---|
| 1-83 | —CH3 | | H |  (4-tert-butyl-methoxyphenyl) | | —OC2H5 |
| 1-84 | —CH3 | | —OCH3 | —C2H5 | | Br |
| 1-85 | —CH3 | | Br | —CH3 | | —OCH3 |
| 1-86 | —CH3 | | —OCH3 | —CH3 | | —CH3 |
| 1-87 | —CH3 | | —OC2H5 | —CH3 | 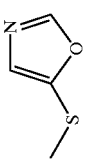 (phenyl) | |
| 1-88 | —CH3 | | —CH3 | —OCH3 | | —OCH3 |
| 1-89 | —CH3 | | —C2H5 | —CH3 | | —CH3 |
| 1-90 | —CH3 | | —C4H9 | —CH3 |  (phenyl) | —CH3 |
| Compound | R6 | R7 | Z1 | Z2 |
|---|---|---|---|---|
| 1-78 | —CH3 | —CH3 |  (methylthio-oxazole) | F |
| 1-79 | —OC2H5 | H | —O—CH2CH2—O—CH2CH2—O—Me | —O—CH2CH2—O—CH2CH2—O—Me |
| 1-80 | —CH3 | —CH3 | —CH2CH2—SCH3 | —CH2CH2—SCH3 |
| 1-81 | —CH3 | —CH3 | —CH2CH2—N(CH3)2 | —CH2CH2—N(CH3)2 |
| 1-82 | —CH3 | —CH3 | —O—CH2CH2—N(CH3)2 | —O—CH2CH2—N(CH3)2 |
| 1-83 | —OC2H5 | Br |  (methoxy-pyrrole) | F |
| 1-84 | —OC2H5 | H | —S—CH2CH2—OCH3 | —S—CH2CH2—OCH3 |

TABLE 1-continued
| | | | |
|---|---|---|---|
| 1-85 | —OCH$_3$ | —CH$_3$ | 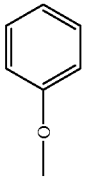  |
| 1-86 | —OCH$_3$ | —CH$_3$ | 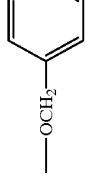  |
| 1-87 | —OC$_2$H$_5$ | —CH$_3$ | 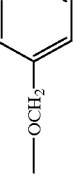 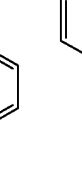 |
| 1-88 | —CH$_3$ | —CH$_3$ | 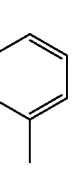 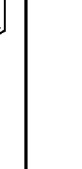 |
| 1-89 | —C$_2$H$_5$ | —CH$_3$ | —OCH$_3$ 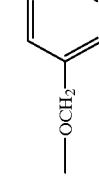 |
| 1-90 | —C$_2$H$_5$ | —CH$_3$ |   |

The dipyrromethene boron complex compound represented by formula (1) of the present invention, concretely the dipyrromethene boron complex compound represented by formula (2) or (5) can be prepared by the following procedure. That is to say, typically, for example, the dipyrromethene boron complex compound represented by formula (2) or (5) can easily be prepared by reacting a compound represented by formula (6):

R₄—CHO  (6)

wherein R₄ is as defined above, with a compound represented by formula (7) and/or formula (8):

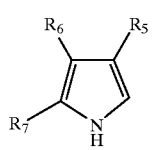
(7)

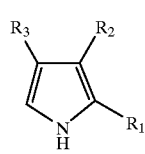
(8)

wherein $R_1$, $R_2$, $R_3$, $R_5$, $R_6$ and $R_7$ are as defined above, in the presence of an acid such as hydrobromic acid or trifluoroacetic acid, oxidizing the reaction product with air or an oxidizing agent such as chloranil, successively reacting the oxidized product with a boron trihalide to obtain a compound represented by formula (9):

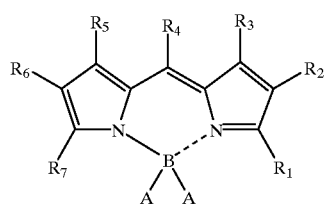
(9)

wherein $R_1$ to $R_7$ are as defined above; and A is a halogen atom such as a fluorine atom, a chlorine atom or a bromine atom, and finally substituting the halogen atom bonded to the boron atom as needed.

Furthermore, the dipyrromethene boron complex compound represented by formula (2) or (5) regarding the present invention in which $R_4$ is a hydrogen atom can easily be prepared in accordance with another method which comprises reacting a compound represented by the above-mentioned formula (7) with a compound represented by formula (10):

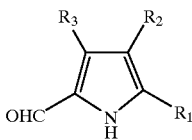
(10)

wherein $R_1$, $R_2$ and $R_3$ are as defined above, or reacting a compound represented by formula (11) and/or formula (12):

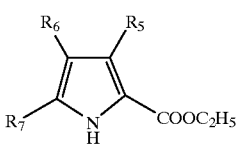
(11)

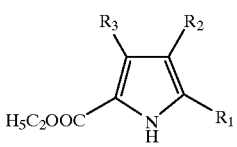
(12)

wherein $R_1$, $R_2$, $R_3$, $R_5$, $R_6$ and $R_7$ are as defined above, in the presence of an acid such as hydrobromic acid, successively reacting the reaction product with a boron trihalide to obtain a compound represented by formula (13):

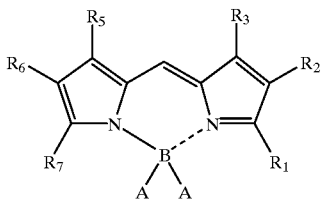
(13)

wherein $R_1$, $R_2$, $R_3$, $R_5$, $R_6$ and $R_7$ are as defined above; and

A is a halogen atom such as a fluorine atom, a chlorine atom or a bromine atom,
and then substituting the halogen atom bonded to the boron atom as needed.

The above-mentioned halogen substitution can easily be carried out by using, in a solvent such as an alcoholic solvent, an ester solvent, an aromatic hydrocarbon solvent, an aliphatic hydrocarbon solvent or an amide solvent, a compound represented by formula (14):

M—Z₁  (14)

wherein $Z_1$ is as defined above; and M is an alkali metal atom such as a sodium atom, a potassium atom or a lithium atom, or an atom group such as magnesium monobromide or magnesium monochloride,
and/or a compound represented by formula (15):

M'—Z₂  (15)

wherein $Z_2$ is as defined above; and M' is an alkali metal atom such as a sodium atom, a potassium atom or a lithium atom, or an atom group such as magnesium monobromide or magnesium monochloride.

The visible light curable resin composition of the present invention comprises a photocurable resin (A), a photoreaction initiator (B) (e.g., a light radical polymerization initiator, a light acid generator or a light base generator or the like) and a photosensitizer (C) using the dipyrromethene boron complex compound having a specific structure.

No particular restriction is put on the photocurable resin (A) which can be used in the present invention, so long as it is a usually usable and photocurable resin having a photosensitive group which can crosslink by light irradiation. Examples of this kind of resin include monomers and prepolymers of compounds having at least one ethylenic unsaturated double bond, oligomers such as dimers and trimers thereof, mixtures thereof, and copolymers thereof. In addition to these compounds, other examples of the photocurable conventional known resin include a polyurethane resin, an epoxy resin, a polyester resin, a polyether resin, an alkyd resin, a polyvinyl chloride resin, a fluorinated resin, a silicone resin, a vinyl acetate resin, a novolak resin or a resin composition comprising two or more of these resins bonded to at least one photopolymerizable unsaturated group, and compounds in which a photopolymerizable unsaturated group is bonded to a modified resin comprising two or more of these resins. Examples of the photopolymerizable unsaturated group include an acryloyl group, a methacryloyl group, a vinyl group, a styryl group, an allyl group, a cinnamoyl group, a cinnamylidene group and an azide group.

As the above-mentioned photocurable resin (A), monofunctional and multifunctional (meth)acrylates are usually used, and examples of the photocurable resin include anionic photocurable resins having a (meth)acryloyl group as the photosensitive group, photocurable resins having a cinnamoyl group as the photosensitive group, and photocurable resins having an allyl group as the photosensitive group, which are mentioned in the passage of page 2, right lower column, line 6 to page 6, left lower column, line 16 of Japanese Patent Application Laid-Open No. 223759/1991. The photocurable resin (A) is preferably used in combination with any of the light radical polymerization initiators mentioned hereinafter. These photocurable resins (A) can be used singly or in the form of a mixture thereof.

It is also possible to use polyethylene glycol di(meth)acrylate having a molecular weight of 300 to 1000 as a typical example of ester compounds of aliphatic polyhydroxy compounds and unsaturated carboxylic acids which are mentioned as ethylenic unsaturated compounds of a photocurable resin component (a2) in the above-mentioned publication.

As the above-mentioned photocurable resin (A), in addition to the above-mentioned compounds, there can be used compounds which can be cured (insolubilized) by a reaction such as polymerization, etherification, pinacol rearrangement, silanol dehydrogenation, intramolecular dehydration condensation or hydrolytic condensation in the presence of an acid, as a catalyst, generated from the light acid generator. Examples of these compounds include glycidylether type epoxy compounds such as bisphenol A type diglycidyl ether, (poly)ethylene glycol diglycidyl ether and trimethylolpropane diglycidyl ether; alicyclic epoxy compounds such as 3,4-epoxycyclohexylmethyl-3,4-epoxycyclohexane carboxylate, dicyclopentadiene dioxide, epoxycyclohexenecarboxylic acid ethylene glycol diester and 1,3-bis[2-{3(7-oxabicyclo[4.1.0]heptyl)}ethyl]-tetramethyldisiloxane [refer to J. Polym. Sci., Part A, Polym. Chem., Vol. 28, p. 479, (1990)]; vinyl ether compounds such as butylene glycol divinyl ether, trimethylolpropane di(1-propenyl)methyl ether, trimethylolpropane di(1-propenyl) butyl ether, trimethylolpropane di(1-propenyl)octyl ether, trimethylolpropane di(1-propenyl)phenyl ether, trimethylolpropane di(1-propenyl) ether acetate, trimethylolpropane di(1-propenyl) ether acrylate and trimethylolpropane di(1-propenyl)N-butyl carbonate [refer to J. Polym. Sci., Part A, Polym. Chem., Vol. 34, p. 2051, (1996)]; alkoxy allene compounds such as dodecyl allene (DA), diethylene glycol diallene (DEGA), triethylene glycol diallene (TEGA), 1-tetrahydrofurfuryl allene ether (THFA), N-hexyloxy-1,2-propadiene (HA), 1,4-di-N-butoxy- 1,2-butadiene (DBB), 1,4-diethoxy-1,2-butadiene and N-hexylpropazyl ether (HPE) [refer to J. Polym. Sci., Part A, Polym. Chem., Vol. 33, p. 2493, (1995)]; oxetane compounds such as 3-ethyl-3-phenoxymethyl-oxetane, phenoxymethyloxetane, methoxymethyloxetane and 3-methyl-3-methoxymethyloxetane [refer to J. Polym. Sci., Part A, Polym. Chem., Vol. 33, p. 1807 (1995)]; ketene acetal compounds such as 2-propylidene-4,5-dimethyl-1,3-dioxolane, 2-propylidene-4-methyl-1,3-dioxolane and 3,9-dithilidene-2,4,8,10-tetraoxaspiro-[5.5]undecane, [refer to J. Polym. Sci., Part A, Polym. Chem., Vol. 34, p. 3091 (1996)]; bicycloortho ester compounds such as 1-phenyl-4-ethyl-2,6,7-trioxabicyclo [2.2.2]-octane [refer to J. Polym. Sci., Polym. Lett. Ed., Vol. 23, p. 359, (1985)]; lactone compounds such as propiolactone, butylolactone, γ-valerolactone, γ-caprolactone, γ-caprylolactone, γ-lauryrolactone and coumarin; aromatic vinyl compounds such as methoxy-α-methylstyrene; heterocyclic vinyl compounds such as vinylcarbazole; melamine compounds such as hexamethylol melamine and hexamethoxy melamine; a copolymer of p-vinylphenol and p-vinylbenzyl acetate; and other aromatic compounds such as trimethylolbenzene and tri(acetoxycarbonylmethyl)benzene. These compounds may have a polymeric structure, so long as they can be cured by a proton of an acid.

It is also possible to use compounds which can be cured (insolubilized) by polymerization or polycondensation under the catalytic function of a base generated from the light base generator, for example, compounds having at least one functional group such as an epoxy group or a silanol group.

In addition to the above-mentioned compounds which can be cured under the catalytic function of the acid or the base generated from the light acid generator or the light base generator, conventional known resins having no unsaturated group can be blended as needed, and examples of these resins include an acrylic resin, a vinyl resin, a polyester resin, an alkyd resin, an epoxy resin, a phenol resin, a rubber and an urethane resin.

As the photoreaction initiator (B) which can be used in the present invention, there can be used a light radical polymerization initiator, a light acid generator and a light base generator.

As the light radical polymerization initiator, conventional known compounds can be used. Examples of these compounds include aromatic carbonyl compounds such as benzophenone, benzoin methyl ether, benzoin isopropyl ether, benzyl, xanthone, thioxanthone and anthraquinone; acetophenones such as acetophenone, propiophenone, α-hydroxyisobutylphenone, α,α'-dichloro-4-phenoxyacetophenone, 1-hydroxy-1-cyclohexylacetophenone and diacetylacetophenone; organic peroxides such as benzoyl peroxide, t-butylperoxy-2-ethylhexanoate, t-butylhydroperoxide, di-t-butyldiperoxybutyldiperoxyisophthalate and 3,3',4,4'-tetra(t-butylperoxycarbonyl)benzophenone; diphenylhalonium salts such as diphenyl iodobromide and diphenyl iodochloride; organic halides such as carbon tetrabromide, chloroform and iodoform; heterocyclic and polycyclic compounds such as 3-phenyl-5-isooxazorone and 2,4,6-tris (trichloromethyl)-1,3,5-triazinebenzanthrone; azo compounds such as 2,2'-azo(2,4-dimethylvaleronitrile), 2,2-azobisisobutyronitrile, 1,1'-azobis(cyclohexane-1-carbonitrile) and 2,2'-azobis(2-methylbutyronitrile); iron-arene complexes (refer to European Patent No. 152377); titanocene compounds (refer to Japanese Patent Application Laid-Open No. 221110/1988); bisimidazole compounds; N-arylglycidyl compounds; acridine compounds; combinations of aromatic ketones and aromatic amines; and peroxyketals (refer to Japanese Patent Application Laid-Open No. 321895/1994). Of the above-mentioned light radical polymerization initiators, di-t-butyl diperoxyisophthalate, 3,3',4,4'-tetra(t-butylperoxycarbonyl)benzophenone, the iron-arene complexes and the titanocene compounds are preferable, because they have a high activity to crosslinking or polymerization.

Furthermore, the light acid generator is a compound which can generate an acid by exposure, and this generated acid is used as a catalyst to cure the above-mentioned compound. As the light acid generator, a conventional known compound can be used. Examples of the light acid generator include onium salts such as sulfonium salts, ammonium salts, phosphonium salts, iodonium salts and selenium salts, iron-arene complexes, silanol-metal chelate complexes, triazine compounds, diazidonaphthoquinone compounds, sulfonic acid esters and sulfonic acid imide esters. In addition to the above-mentioned compounds, it is also possible to use the light acid generators mentioned in Japanese Patent Application Laid-Open No. 146552/1995 and Japanese Patent Application No. 289218/1997.

Moreover, the light base generator is a compound which can generate a base by exposure, and this generated base is used as a catalyst to cure the above-mentioned compound. As the light base generator, a conventional known compound can be used. Examples of the light base generator include nitrobenzylcarbamate compounds such as [(o-nitrobenzyl)oxy]carbonylcyclohexylamine [refer to J. Am. Chem. Soc., Vol. 113, No. 11, p. 4305 (1991)] and photo-functional urethane compounds such as N-[{1-(3,5-dimethoxyphenyl)-1-methyl-ethoxy}carbonyl] cyclohexylamine and N-[{1-(3,5-dimethoxyphenyl)-1-methyl-etoxy}carbonyl]pyridine [refer to J. Org. Chem., Vol. 55, No. 23, p. 5919, (1990)].

A blend ratio of the photoreaction initiator is not critical, and it can be varied in a wide range in compliance with the kind of photoreaction initiator. In general, the amount of the photoreaction initiator is in the range of 0.1 to 25 parts by weight, preferably 0.2 to 10 parts by weight with respect to 100 parts by weight (solid content) of the photocurable resin. If the amount of the photoreaction initiator is more than 25 parts by weight, the stability of the obtained composition tends to deteriorate.

The visible light curable resin composition of the present invention contains at least one of the dipyrromethene boron complex compounds represented by formula (1) as the photosensitizer (C), and it may contain another conventional known photosensitizer.

No particular restriction is put on the known photosensitizer, so long as it is usually used, but examples of the photosensitizer include ketocoumarin, coumarin-6 and coumarin compounds mentioned in Japanese Patent Application Laid-Open No. 18088/1992.

In this case, no particular restriction is put on the amount of the dipyrromethene boron complex compound represented by formula (1) in the photosensitizer (C), but in order to obtain a desired effect in the present invention, the content of the dipyrromethene boron complex compound represented by formula (1) in the photosensitizer (C) is preferably 10% by weight or more, more preferably 20% by weight or more, much more preferably 30% by weight or more. Particularly preferable is the photosensitizer containing 50% by weight or more of the dipyrromethene boron complex compound.

The amount of the photosensitizer (C) to be used depends on the kind and the amount of photosensitizer (C) as well as the kind of photocurable resin (A) component which can interact with the photosensitizer (C), but in general, the amount of the photosensitizer (C) is suitably in the range of 0.1 to 10 parts by weight, preferably 0.3 to 5 parts by weight with respect to 100 parts by weight of the photocurable resin (A) component. If the amount of the photosensitizer (C) is less than 0.1 part by weight, the photosensitivity of the formed coating film tends to deteriorate, and if it is more than 10 parts by weight, there is a tendency that it is difficult to keep the composition in a uniform state from the viewpoint of solubility.

If necessary, the visible light curable resin composition which can be used in the present invention can contain a photopolymerizable unsaturated compound (resin) other than mentioned above, in addition to the above-mentioned components. Examples of the photopolymerizable unsaturated compound include methyl (meth)acrylate, ethyl (meth)acrylate, butyl (meth)acrylate, 2-ethylhexyl (meth)acrylate, (poly)ethylene glycol di(meth)acrylate, (poly)propylene glycol tri(meth)acrylate, trimethylolpropane tri(meth)acrylate, glycerine tri(meth)acrylate, pentaerythritol tetra (meth)acrylate and pentaerythritol tri(meth)acrylate.

The amount of the other photopolymerizable unsaturated compound to be used is preferably in the range of about 0 to 50% by weight, more preferably about 0.1 to 40% by weight with respect to the total weight of the composition (solid content).

In the present invention, if necessary, a radical protecting compound (D) can be blended with the visible light curable composition. The radical protecting compound (D) functions to prevent the deactivation, by oxygen, of radicals generated when a resist film formed from the visible light curable composition is cured by the irradiation of a visible light laser, whereby a good sensitivity can be imparted to the resist even in the presence of oxygen. In the present invention, as the radical protecting compound (D), there can be suitably used at least one compound selected from phosphorous acid ester compounds and aromatic compounds having an N,N-dimethyl amino group bonded to a carbon atom which forms an aromatic ring.

In the visible light curable resin composition, the radicals generated by the light irradiation react with oxygen to become peroxy radicals, if oxygen is present, and the peroxy radicals usually react with each other to become oxygen molecules, whereby the radicals are inconveniently deactivated. However, when the radical protecting compound (D) is allowed to exist in the composition in accordance with the present invention, it can be presumed that most of the above-mentioned peroxy radicals react with the radical protecting compound (D) to produce other radicals, and these other radicals contribute to the curing reaction of the resist film. As a result, the visible light curable resin composition of the present invention can maintain the high sensitivity, even if oxygen is not blocked.

Typical examples of the above-mentioned phosphorous acid ester compounds include dialkyl, diaryl and diaralkyl esters of phosphorous acids such as dimethylphosphite, diethylphosphite, dipropylphosphite, dibutylphosphite, bis (2-ethylhexyl) phosphite, diphenylphosphite and dibenzylphosphite; trialkyl and triaryl esters of phophorous acids such as trimethylphosphite, triethylphosphite, triisopropylphosphite, tributylphosphite, trilaurylphosphite, triphenylphosphite, triisodecylphosphite and tris(tridecyl)-phosphite; aralkyldialkyl esters of a phophorous acid such as benzyldiethylphosphite; and tri(haloalkyl) esters of phophorous acids such as tris(2,2,2-trifluoroethyl)-phosphite and tris(2-chloroethyl)-phosphite.

Typical examples of the above-mentioned aromatic compounds having the N,N-dimethylamino group bonded to the carbon atom which forms the aromatic ring include N,N-dimethylaniline derivatives such as N,N-dimethylaniline, 4-bromo-N,N-dimethylaniline, 4-t-butyl-N,N-dimethylaniline, 2,6-diisopropyl-N,N-dimethylaniline, 4,4'-vinylidenebis(N,N-dimethylaniline), 4,4'-methylenebis(N,N-dimethylaniline), 4,4'-methylenebis(2,6-diisopropyl-N,N-dimethylaniline), N,N,2,4,6-pentamethylaniline, N,N-dimethyl-m-toluidine, 4-(2-pyridylazo)-N,N-dimethylaniline and N,N-dimethyl-4-nitrosoaniline.

Above all, the aromatic compounds having the N,N-dimethyl amino group bonded to the carbon atom which forms the aromatic ring and having a molecular weight of 120 to 400 are particularly preferable from the viewpoints of compatibility with the resin of the resist and the sensitivity of the obtained resist film to the visible light.

The amount of the above-mentioned specific radical protecting compound (D) to be blended is not strictly limited, and it can be varied in compliance with the kind and the amount of photoreaction initiator (B) to be used. In general, the amount of the radical protecting compound (D) is preferably in the range of 0 to 30 parts by weight, more preferably 1 to 10 parts by weight with respect to 100 parts by weight of the solid content of the visible light curable resin composition, in points of the photosensitivity of the resist film and the strength of the coating film.

To the visible light curable resin composition of the present invention, some additives can be added, as needed. Examples of the additives include an adhesion improver, a polymerization inhibitor such as hydroquinone, 2,6-di-t-butyl-p-cresol or N,N-diphenyl-p-phenylenediamine, a rubber, fine particles of an organic resin such as a vinyl polymer or a vinyl polymer having an unsaturated group, a pigment such as a coloring pigment or an extender pigment, a metal oxide such as cobalt oxide, a plasticizer such as dibutyl phthalate, dioctyl phthalate, tricresyl phosphate, polyethylene glycol or polyprpylene glycol, a cissing inhibitor and a fluidity adjustor.

The above-mentioned adhesion improver is mixed to improve the adhesion of the coating film to a substrate, and examples of the adhesion improver include tetrazoles such as tetrazole, 1-phenyltetrazole, 5-aminotetrazole, 5-amino-1-methyltetrazole, 5-amino-2-phenyltetrazole, 5-mercapto-1-phenyltetrazole, 5-mercapto-1-methyltetrazole, 5-methylthiotetrazole and 5-chloro-1-phenyl-1H-tetrazole.

The composition of the present invention can be used under the irradiation circumstance of a safelight having a maximum wavelength and a high spectral luminous efficiency selected within the range of 500 to 620 nm. When the composition is used under this safelight, an absorbency of the unexposed coating film formed from the composition is 0.5 or less within the range of the maximum wavelength ±30 nm of the safelight.

Figure 5:
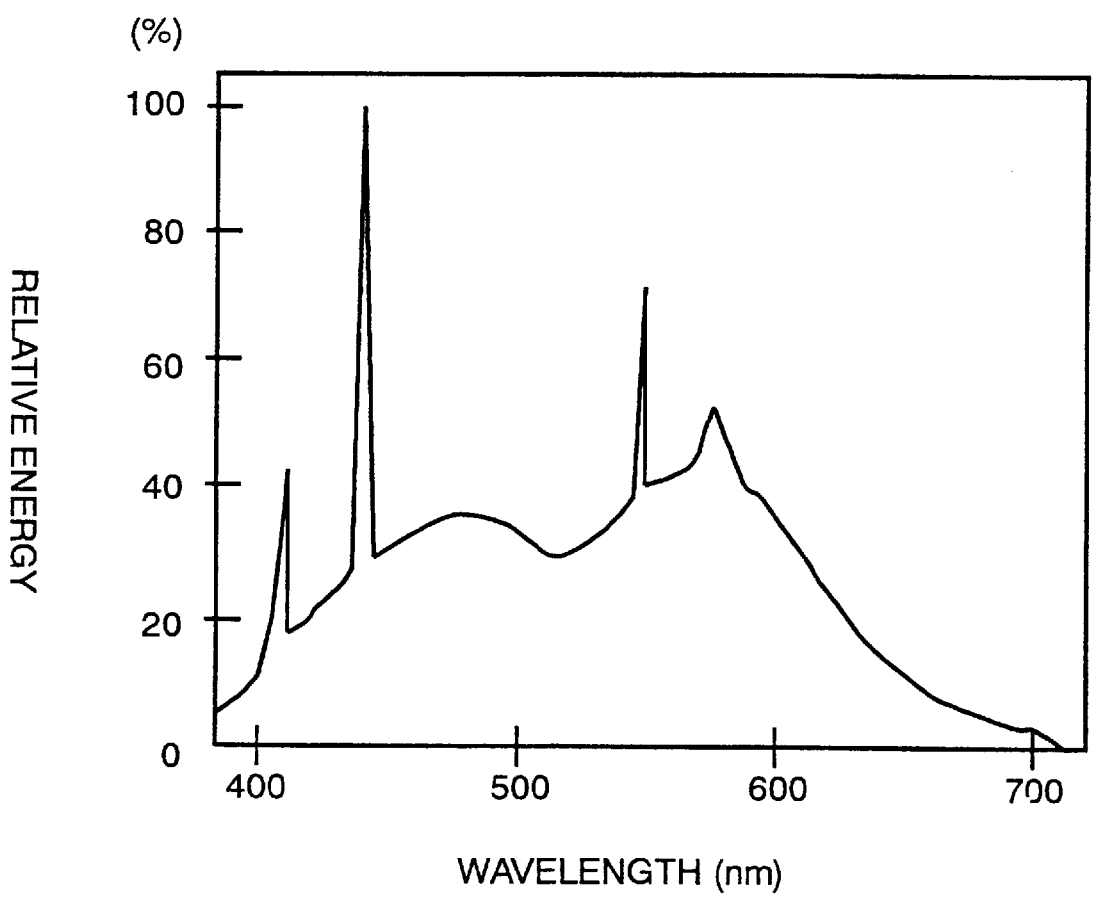
FIG. 5 is a graph showing a spectral distribution of a conventional fluorescent lamp.

As a conventional safelight, a fluorescent lamp which is colored red has been used, but an emission spectrum of the fluorescent lamp has a wavelength range within a wide range of from an ultraviolet light to a visible light region (FIG. 5). Therefore, this fluorescent lamp cures even a portion of the visible light-sensitive resin coating film which does not need to be cured, so that any clear resist pattern cannot be formed by a developing treatment. This drawback is compensated by lowering the intensity of the light, which inconveniently makes a working circumstance dark. On the contrary, in the present invention, there is employed the safelight, for example, a sodium lamp having a sharp wavelength, whereby the above-mentioned problem can be solved.

That is to say, the safelight for use in the present invention is a visible light having a high spectral luminous efficiency and a maximum wavelength selected within the range of 500 to 620 nm, preferably 510 to 600 nm. This safelight can be obtained, for example, by using a discharge lamp in which the light having the maximum wavelength in the above-mentioned range can be emitted by discharging the lamp itself in a gas such as sodium. Of various discharge lamps, the sodium lamp is excellent in safety properties, working circumstance properties and the like, because the light emitted from the sodium lamp consists mainly of a yellow D-ray having a wavelength of 589 nm and it is a monochromatic light, so that a chromatic aberration of the light is low and hence objects can be sharply displayed. FIG. 1 shows a spectral distribution diagram of the low-pressure sodium lamp. As shown in this spectral distribution diagram of the sodium lamp, in addition to the D-ray which is the maximum wavelength of the sodium lamp, the safelight may have a high-energy ray wavelength component (a short-wavelength range) to such a degree as not to adversely affect the visible light-sensitive resin composition.

Figure 2:
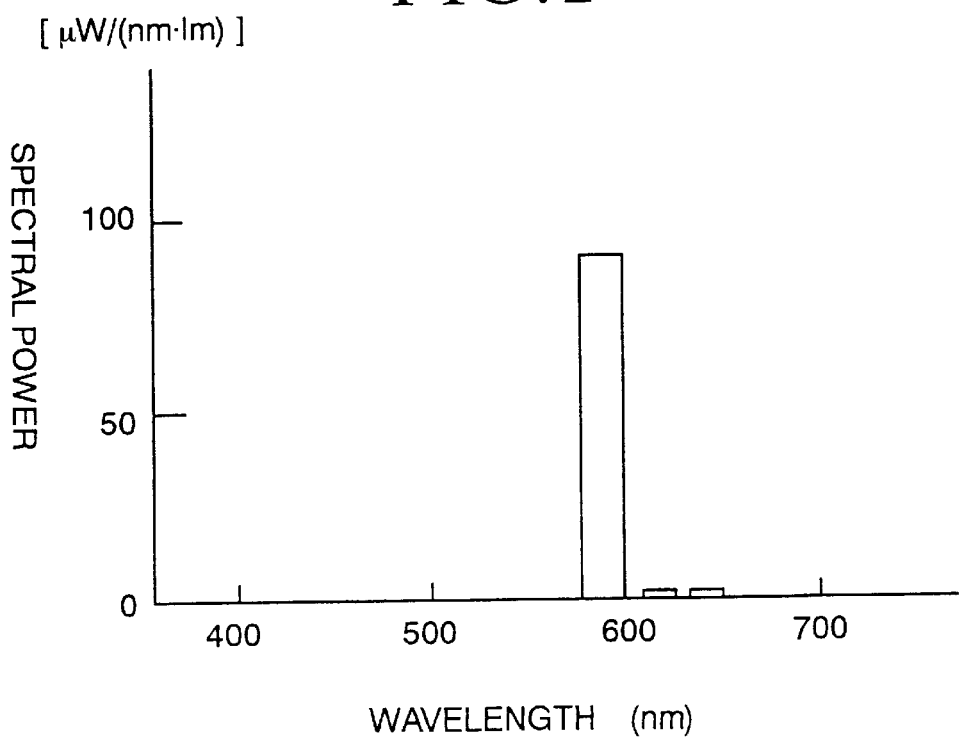
FIG. 2 is a graph showing a spectral distribution of the sodium discharge lamp to which a filter is attached.

Furthermore, a light emitted from the sodium lamp equipped with a filter to cut high-energy ray wavelength components other than the D-ray can also be used as the safelight. The spectral distribution of the sodium lamp in which the high-energy ray wavelength components are cut is shown in FIG. 2. Examples of the filter include "Fantac FD-1081 Scarlet", "Fantac FC-1431 Sunflower Yellow" (both of them are trade marks and made by Kansai Paint Co., Ltd.), and "Lintech Lumicool film No. 1905" (a trade mark, made by Lintech Co., Ltd.).

Moreover, the safelight for use in the present invention is preferably a sharp monochromatic light of 589 nm such as the light from the sodium lamp, but in addition to the light having the maximum wavelength in the range of 500 to 620 nm, there may be used a safelight containing a wavelength component which is distributed in a wavelength range of an ultraviolet light range, a visible light range other than the above-mentioned range or an infrared light range. However, when the safelight containing the wavelength component distributed in any of such other ranges is used, this wavelength distribution range is required to be the range of the safelight which does not have an adverse influence (sensitization) on the visible light-sensitive resin composition.

Such a safe high-energy light wavelength range (a low wavelength range) is concerned with the distributed energy intensity of the light and the absorbency of the visible light-sensitive resin composition in this range. When the energy intensity of the light is high, the composition having the low absorbency can be used, and when the energy intensity of the light is low, the composition having a relatively higher absorbency than the former can be used. In view of these requirements, the safelight can contain the high-energy light range to such a degree as not to adversely affect the visible light-sensitive resin composition. However, a usual fluorescent lamp having a maximum wavelength of 500 to 620 nm cannot be used as the safelight for the visible light curable resin composition which is to be sensitized by the visible laser having an oscillation line especially at 488 nm or 532 nm, because this type of fluorescent lamp has the high light energy in less than 500 nm, especially in 400 to 499 nm.

The absorbency defined in the present invention is represented by the formula of $-\log (I/I_0)$ wherein I is an intensity of the light transmitted through a coating film formed by applying the visible light curable resin composition onto the surface of a transparent substrate and then drying the same (removing the solvent); and $I_0$ is an intensity of the light transmitted through a blank [the transparent substrate (e.g., a polyethylene terephthalate sheet) onto which the sample (the photosensitive resin composition) is applied].

Figure 3:
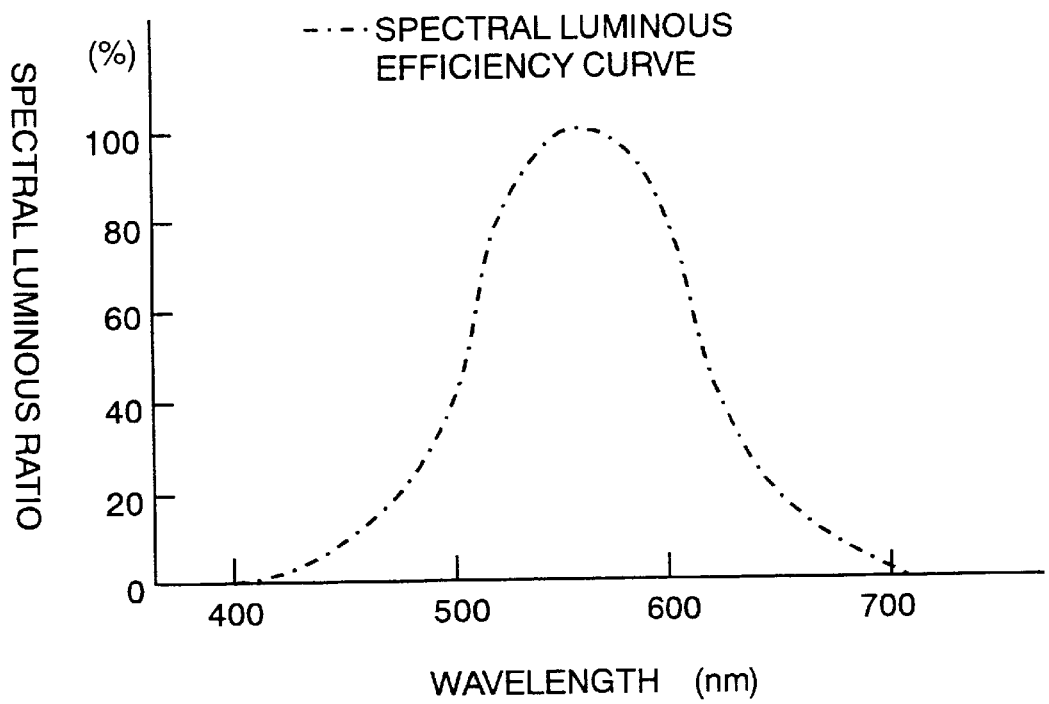
FIG. 3 is a graph showing a spectral luminous efficiency curve.

An extent of a light brightness which human eyes can perceive can be represented by the spectral luminous efficiency. As defined in JIS Z8113-2005, this spectral luminous efficiency can be defined as the reciprocal of a relative value of a radiation luminance of a monochromatic light having a wavelength λ when the brightness of the monochromatic light having the wavelength λ is judged to be equal to that of a reference for comparison under predetermined observational conditions, and usually, it can be defined as a value standardized so that the maximum value may become 1 when the wavelength λ is varied. FIG. 3 shows a spectral luminous efficiency curve in the range of 380 to 780 nm that is the wavelength range of the visible light. In FIG. 3, the ratio of the spectral luminous efficiency is shown on the assumption that the maximum value of the spectral luminous efficiency on the ordinate axis is 100. It is apparent from this curve that in the range of 640 to 780 nm which is the conventional wavelength range of red, the spectral luminous efficiency is low and this range is perceived to be dark by human eyes, and for example, in order for the human eyes to perceive the same brightness as at a wavelength of 589 nm, the intensity of the irradiated light must be further increased. In addition, the maximum value of a luminosity is about 555 nm (JIS-Z8113 2008).

The absorbency of the unexposed coating film formed from the visible light curable resin composition of the present invention is 0.5 or less, preferably 0.2 or less, more preferably 0.1 or less in the range of the maximum wavelength ±30 nm (−30 nm to +30 nm), preferably the maximum wavelength ±20 nm (−20 nm to +20 nm), or more preferably the maximum wavelength ±10 nm (−10 nm to +10 nm) of the safelight having the maximum wavelength selected within the above-mentioned range.

The thickness of the dry film (exclusive of the solvent) formed from the visible light curable resin composition of the present invention is set so that the absorbency of the unsensitized coating film formed from this composition may be 0.5 or less in the range of the maximum wavelength ±30 nm selected within the above-mentioned range of the maximum wavelength of the safelight, but from a practical viewpoint, it is usually in the range of 0.1 to 50 μm, preferably 1 to 30 μm. Furthermore, the absorbency depends on kinds and amounts of the photoreaction initiator (B), the photosensitizer (C) and the like contained in the composition, and in the case of the same composition, it also depends on the thickness of the coating film. That is to say, in the same composition, when the thickness of the coating film increases, the concentrations of the photoreaction initiator (B), the photosensitizer (C) and the like contained in the coating film increase, so that the absorbency increases.

On the other hand, when the thickness of the coating film decreases, the concentrations of the above-mentioned components contained in the coating film decrease, so that the absorbency decreases. It is apparent from the foregoing that the absorbency can be adjusted so as to be within the above-mentioned range by adjusting the thickness of the coating film to be formed.

The visible light curable resin composition of the present invention can be used for a variety of applications as known photosensitive materials such as coating compositions, inks, adhesives, resist materials, printing plate materials (printing materials for planography and letter-press, and presensitized plates for offset lithography), information recording materials, and materials for relief images.

Next, typical resist materials (e.g., a general negative-type curable resist material and a negative-type curable resist material for electrodeposition coating) of the visible light curable resin composition of the present invention will be described.

As the general negative-type curable resist material, for example, the visible light curable resin composition of the present invention is dispersed or dissolved in a solvent (inclusive of water) (in the case that a pigment is used as a colorant, the pigment is finely dispersed), thereby preparing a photosensitive solution, and this photosensitive solution is applied onto a substrate by the use of a coating device such as a roller, a roll coater or a spin coater, and then dried.

Furthermore, the surface of the coating film can be previously covered with a cover coat layer prior to being cured by exposure to the visible light. This cover coat layer is formed for the purpose of blocking oxygen in air to prevent radicals generated by the exposure from being inactivated by the oxygen, and for the purpose of smoothly advancing the curing of the coating film by the exposure.

This cover coat layer can be formed, for example, by covering the surface of the applied coating film with a resin film (film thickness=about 1 to 70 μm) of a polyester resin such as polyethylene terephthalate, an acrylic resin, a polyethylene, a polyvinyl chloride resin or the like; or by applying, onto the surface of the applied coating film, an aqueous solution prepared by dissolving or dispersing an aqueous resin (dry film thickness=about 0.5 to 5 μm) in water and then drying it. In this case, examples of the aforesaid aqueous resin include polyvinyl alcohol, a partially saponificated compound of polyvinyl acetate, a copolymer of polyvinyl alcohol and vinyl acetate, a copolymer of the partially saponificated compound of polyvinyl acetate and vinyl acetate, polyvinyl pyrrolidone, a water-soluble polysaccharide polymer such as pullulan, and an acrylic resin, a polyester resin, a vinyl resin and an epoxy resin containing a basic group, an acidic group or a base. This cover coat layer is preferably removed after the exposure of the coating film and before the developing treatment. This cover coat layer of the water-soluble polysaccharide polymer or the aqueous resin can be removed, for example, with a solvent such as water, an acidic aqueous solution or a basic aqueous solution in which the resin can be dissolved or dispersed.

Examples of the solvent which can be used to dissolve or disperse the visible light curable resin composition include ketones (e.g., acetone, methyl ethyl ketone and methyl isobutyl ketone), esters (e.g., ethyl acetate, butyl acetate, methyl benzoate and methyl propionate), ethers (e.g., tetrahydrofuran, dioxane and dimethoxyethane), cellosolves (e.g., methyl cellosolve, ethyl cellosolve and diethylene glycol monomethyl ether), aromatic hydrocarbons (e.g., benzene, toluene, xylene and ethylbenzene), halogenated hydrocarbons (e.g., chloroform, trichloroethylene and dichloromethane), alcohols (e.g., ethyl alcohol and benzyl alcohol), other solvents (e.g., dimethylformamide and dimethyl sulfoxide), and water.

Furthermore, examples of the substrate include metals such as aluminum, magnesium, copper, zinc, chromium, nickel and iron, alloy sheets containing these metals as components, and printed circuit boards, plastics, glasses, silicone wafers and carbon plate whose surfaces are treated with these metals.

Moreover, when used as a negative-type resist material for electrodeposition coating, the visible light curable resin composition is first brought into an aqueous dispersion or an aqueous solution.

The aqueous dispersion or the aqueous solution of the visible light curable resin composition can be formed by (1) neutralizing the composition with an alkali (a neutralizer) when an anionic group such as a carboxyl group is introduced in the photocurable resin, or (2) neutralizing it with an acid (a neutralizer) when a cationic group such as an amino group is introduced therein. Examples of the alkali neutralizer which can be used at this time include alkanolamines such as monoethanolamine, diethanolamine and triethanolamine; alkylamines such as triethylamine, diethylamine, monoethylamine, diisopropylamine, trimethylamine and diisobutylamine; alkylalkanolamines such as dimethylaminoethanol; alicyclic amines such as cyclohexylamine; hydroxides of alkali metals such as caustic soda and caustic potash; and ammonia. Furthermore, examples of the acid neutralizer include monocarboxylic acids such as formic acid, acetic acid, lactic acid and butyric acid. These neutralizers can be used singly or in the form of a mixture thereof. The amount of the neutralizer to be used is usually in the range of 0.2 to 1.0 equivalent, preferably 0.3 to 0.8 equivalent per equivalent of the ionic group contained in the visible light curable resin composition.

In order to further improve the flowability of the resin component dissolved or dispersed in water, a hydrophilic solvent can be added to the above-mentioned visible light curable resin composition, if necessary, and examples of the hydrophilic solvent include methanol, ethanol, isopropanol, n-butanol, t-butanol, methoxyethanol, ethoxyethanol, butoxyethanol, diethylene glycol monomethyl ether, dioxane and tetrahydrofuran. The amount of the hydrophilic solvent to be used is usually 300 parts by weight or less, preferably 100 parts by weight or less with respect to 100 parts by weight of the resin solid component.

Furthermore, in order to increase the amount of the resin component to be applied onto the substrate, a hydrophobic solvent can be added to the above-mentioned visible light curable resin composition, and examples of the hydrophobic solvent include petroleum solvents such as toluene and xylene; ketones such as methyl ethyl ketone and methyl isobutyl ketone; esters such as ethyl acetate and butyl acetate; and alcohols such as 2-ethylhexyl alcohol and benzyl alcohol. The amount of the hydrophobic solvent to be added is usually 200 parts by weight or less, preferably 100 parts by weight or less with respect to 100 parts by weight of the resin solid component.

The preparation of the visible light curable resin composition as an electrodeposition coating composition can be carried out by a conventional known method. For example, it can be prepared by sufficiently mixing the photocurable resin (A) dissolved in water by the above-mentioned neutralization, the photoreaction initiator (B), the photosensitizer (C) having a specific structure, a radical protecting compound (D) as needed, the solvent and other components, and then adding water to the mixture.

The thus prepared composition can be further diluted with water in a usual manner to obtain an electrodeposition coating composition (or an electrodeposition bath), for example, having a pH of 4 to 9 and a bath concentration (a solid content concentration) in the range of 3 to 25% by weight, preferably 5 to 15% by weight. The electrodeposition coating composition prepared as described above can be applied onto the surface of a conductor which is a material to be coated in the following manner. That is to say, the pH and the concentration of the bath are first adjusted to be within the above-mentioned ranges, and the bath temperature is then controlled so as to be in the range of 15 to 40° C., preferably 15 to 30° C. Next, a DC voltage of 5 to 200 V is applied to the thus controlled electrodeposition bath, while the conductor to be coated is immersed in the bath as an anode when the deposition coating composition is an anionic type, or as a cathode when the deposition coating composition is a cationic type. A voltage application time is suitably in the range of 10 seconds to 5 minutes.

As the electrodeposition coating technique, there can also be carried out a method of applying an electrode-position coating composition having a low glass transition temperature to the material to be applied, washing it with water, or washing it with water and drying, and then applying another electrodeposition coating composition having a glass transition temperature of 20° C. or more (refer to Japanese Patent Application Laid-Open No. 20873/1990), i.e., a method of conducting a double-coat electrodeposition coating.

The thickness of the obtained coating film is usually in the rage of 0.1 to 50 μm, preferably 1 to 15 μm in terms of the dry coating film thickness. After the electrodeposition coating, the applied substrate is taken out of the electrodeposition bath, washed with water, and then dried with hot air to remove water content from the electrodeposited coating film.

Examples of the usable conductor include conductive materials such as metals, carbon and tin oxides as well as plastics and glasses whose surfaces are fixedly covered with these conductive materials by lamination, plating or the like.

Furthermore, a cover coat layer may be previously formed on the surface of the electrodeposited coating film prior to the exposure and the curing with the visible light. Examples of this cover coat layer include the materials mentioned above. The cover coat layer is preferably removed before the electrodeposited coating film is subjected to the developing treatment. The cover coat layer comprising the water-soluble polysaccharide polymer or the aqueous resin can be removed with, for example, a solvent such as water, an acidic aqueous solution or a basic aqueous solution which can dissolve or disperse the used resin.

The visible light resist material formed on the conductor surface in the above-mentioned manner, or the electrodeposited visible light resist coating film obtained by the electrodeposition coating is exposed to the visible light in accordance with an image and cured, and an unexposed portion is then removed by the developing treatment, thereby forming the image.

As for a light source for curing the composition for the visible light-sensitive material of the present invention, a conventional known visible light source can be used without any particular restriction, so long as it can cure the composition. Examples of the light source which can emit the visible light include an ultra-high pressure, a high pressure, an intermediate pressure or a low pressure mercury-vapor lamp, a chemical lamp, a carbon-arc lamp, a xenon lamp, a metal halide lamp and a tungsten lamp. Moreover, there can also be used various lasers having an oscillation line in the visible light range in which an ultraviolet light is cut from the above-mentioned light sources through an ultraviolet light cut filter. Above all, an argon laser having an oscillation line at 488 nm or a YAG-SHG laser having an oscillation line at 532 nm is desirable.

The developing treatment can be carried out by washing out the unexposed portion of the coating film with an aqueous alkaline solution when the unexposed coating film portion is anionic, or with an aqueous acidic solution having a pH of 5 or less when it is cationic. Usual examples of the usable alkaline aqueous solution include caustic soda, sodium carbonate, caustic potash and aqueous ammonia which can neutralize a free carboxylic acid contained in the coating film to make the coating film water-soluble, whereas examples of the usable aqueous acidic solution include acetic acid, formic acid and lactic acid.

Furthermore, in the case of the photocurable resin having no ionic group, the developing treatment can be carried out by dissolving the unexposed portion with a solvent such as 1,1,1-trichloromethane, trichloroethylene, methyl ethyl ketone or methylene chloride. The thus developed coating film is washed with water, and then dried by hot air to form a desired image on the conductor. If necessary, etching can be done to remove an exposed conductive portion, and a resist film can be then removed to prepare a print circuit board.

In addition to the above-mentioned use applications, for example, the composition for the visible light-sensitive material of the present invention can be applied onto a transparent resin film of a polyester resin such as polyethylene terephthalate, an acrylic resin, a polyethylene, a polyvinyl chloride resin or the like which becomes a cover film layer by the use of a roll coater, a blade coater or a curtain coater, followed by drying to form a resist film (the thickness of the dry film=about 0.1 to 5 μm). Afterward, a protective film is then laminated on this coating film to obtain a dry film resist.

From such a dry film resist, the protective film can be peeled off, and the dry film resist can be then laminated on a support so that the dry film resist may come in contact with the support by a means such as thermocompression bonding, thereby forming the resist film. The resist film can be exposed to the visible light, cured and then developed in accordance with an image in the same manner as in the case of the above-mentioned electrodeposition coating, thereby forming the image. Furthermore, on the dry film resist, the cover coat layer can be formed in the same manner as described, when needed. This cover coat layer may be formed by its application or by its adhesion onto the resist film. The cover coat layer may be removed or need not be removed prior to the developing treatment.

The present invention will be described in more detail in accordance with examples.

Incidentally, "part(s)" in examples and comparative examples which will be described hereinafter means "part(s) by weight".

SYNTHETIC EXAMPLE 1

Synthesis of Compound 1-1 in Table 1

24.4 g of 2,4-dimethyl-3-ethylpyrrole, 8.4 g of 35% formalin and 500 ml of ethanol were stirred and dissolved under an air atmosphere, and after 17 g of 47% hydrobromic acid was added dropwise, reaction was carried out at room temperature for 12 hours. The solvent was concentrated and distilled off, and 500 ml of water was added to the residue and the reaction product was then extracted with 500 ml of chloroform. The thus obtained chloroform phase was washed with 1 liter of water, further washed with 200 ml of a saturated saline solution, and then dried over 20 g of sodium sulfate. Insolubles were removed by filtration, and 78 g of N-ethyl-N,N-diisopropylamine were added to the resultant filtrate. Next, 85.2 g of boron trifluoride diethyl ether complex was added thereto and reaction was then carried out at room temperature for 6 hours. After completion of the reaction, the reaction product was washed with 500 ml of water, further washed with 200 ml of a saturated saline solution, and then dried over 20 g of sodium sulfate. Afterward, insolubles were removed by filtration, the resultant filtrate was concentrated, and the residue was treated by a silica gel column chromatography (a developing solution= chloroform) to collect a main component. After the collected solution was concentrated, recrystallization was done by the use of n-hexane and chloroform to purify the component, followed by drying at 60° C., to obtain 9.3 g of 4,4-difluoro-2,6-diethyl-1,3,5,7-tetramethyl-4-bora-3a,4a-diaza-s-indacene.

In succession, 9.2 g of the above-mentioned boron compound was added to a methanol solution of sodium methoxide prepared by adding 3.47 g of metallic sodium to 380 ml of methanol, and reaction was carried out at 55 to 60° C. for 2 hours. After completion of the reaction, 1 liter of water was added thereto, and a desired compound was extracted with 600 ml of chloroform. The chloroform phase was washed with 1.5 liter of water and further 200 ml of a saturated saline solution, and then dried over 50 g of sodium sulfate. Next, filtration was done to obtain a filtrate and this filtrate was then concentrated, and the residue was treated by a silica gel column chromatography [a developing solution= chloroform-ethyl acetate mixing solvent (1:1)] to collect a main component. After the collected solution was concentrated, recrystallization was done by the use of chloroform to purify the component, followed by drying at 60° C., to obtain 5.4 g (yield=17%) of 4,4-dimethoxy-2,6-diethyl-1,3,5,7-tetramethyl-4-bora-3a,4a-diaza-s-indacene.

The results of the elemental analysis of the obtained compound are as follows:

|  | C (%) | H (%) | N (%) |
|---|---|---|---|
| Calcd. | 69.52 | 8.90 | 8.58 |
| Found | 69.69 | 8.76 | 8.50 |

SYNTHETIC EXAMPLE 2

Synthesis of Compound 1-88 in Table 1

57.4 g of ethyl-4,5-dimethyl-3-methoxypyrrole-2-carboxylate, 100.4 g of 88% formic acid and 85.2 g of 47% hydrobromic acid were mixed, and the mixture was heated up to 95° C., followed by stirring for 3 hours. After cooled to room temperature, the reaction solution was extracted with 600 ml of chloroform. The chloroform phase was washed with 2 liters of water and successively 200 ml of a saturated saline solution, and then dried over 20 g of sodium sulfate. Next, filtration was done to obtain a filtrate, and to this filtrate, 113 g of N-ethyl-N,N-diisopropylamine was added. Further, 123.5 g of boron trifluoride diethyl ether complex was added thereto, and reaction was then carried out at room temperature for 12 hours. After completion of the reaction, the resultant organic phase was washed with 500 ml of water and further 200 ml of a saturated saline solution, and then dried over 20 g of sodium sulfate. Next, filtration was done to obtain a filtrate and this filtrate was then concentrated, and the residue was treated by a silica gel column chromatography (a developing solution: n-hexane/chloroform=35/65) to collect a main component. After the collected solution was concentrated, purification was performed by recrystallization from n-hexane and chloroform, followed by drying at 60° C., to obtain 0.6 g (yield=1.4%) of 4,4-difluoro-2,3,5,6-tetramethyl-1,7-dimethoxy-4-bora-3a,4a-diaza-s-indacene.

The results of the elemental analysis of the obtained compound are as follows:

|  | C (%) | H (%) | N (%) |
|---|---|---|---|
| Calcd. | 58.47 | 6.22 | 9.09 |
| Found | 58.55 | 6.33 | 9.16 |

EXAMPLE 1

A photosensitive solution was prepared by using 100 parts of a polymer as a photocurable resin (a polymeric binder) which was a mixture of methyl methacrylate/methacrylic acid/hydroxyphenyl methacrylate/benzyl methacrylate=50/20/10/20 (parts by weight), 55 parts of trimethylolpropane triacrylate, 1.5 parts of a compound 1-1 as a photosensitizer in Table 1, 20 parts of a titanocene compound as a photoreaction initiator represented by formula (a):

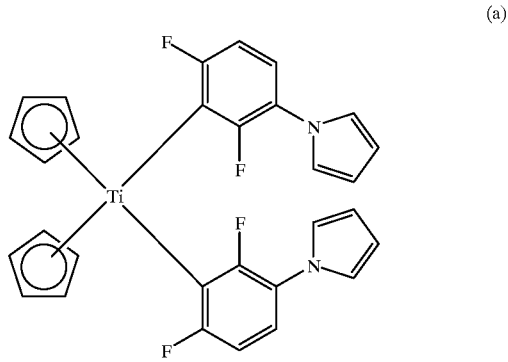

and 160 parts of methyl cellosolve as a solvent.

The thus obtained photosensitive solution was applied onto a copper-clad and glass-fiber-reinforced epoxy substrate having a copper layer of 18 μm in thickness on its surface and having a thickness of 2 mm and a size of 350×460 mm by the use of a spinner, and then dried at 60° C. for 10 minutes to prepare the substrate having a resist film of 5 μm in dry thickness. Next, this substrate having the resist film was irradiated at an intensity of 5 mJ/cm² with a xenon lamp (an ultraviolet wavelength range was cut) and a second harmonic (532 nm) of a YAG laser, and at this time, it was confirmed that the resin was rapidly cured [the cured resin was not dissolved by a developing treatment in which the substrate was immersed in a 1% aqueous sodium carbonate solution (a developing solution) at 30° C. for 1 minute].

Furthermore, after allowed to stand at room temperature for 6 months, the unexposed substrate was irradiated with the xenon lamp (the ultraviolet wavelength range was cut) and the second harmonic (532 nm) of the YAG laser in the same manner as described above, and at this time, it was confirmed that the resin was rapidly cured.

EXAMPLES 2 TO 90

The same procedure as in Example 1 was conducted except that compounds 1-2 to 1-90 in Table 1 were used as photosensitizers, thereby preparing photosensitive solutions. Afterward, by the use of each of these photosensitive solutions, a resist film was formed on a substrate in the same manner as in Example 1, and the substrate having the resist film was then irradiated at an intensity of 5 mJ/cm² with a xenon lamp (an ultraviolet wavelength range was cut) and a second harmonic (532 nm) of a YAG laser, and at this time, it was confirmed that the resin was rapidly cured [the cured resin was not dissolved by a developing treatment in which the substrate was immersed in a 1% aqueous sodium carbonate solution (a developing solution) at 30° C. for 1 minute].

Furthermore, after allowed to stand at room temperature for 6 months, the unexposed substrate was irradiated with the xenon lamp having an intensity of 5 mJ/cm² (the ultraviolet wavelength range was cut) and the second harmonic (532 nm) of the YAG laser in the same manner as described above, and at this time, it was confirmed that the resin was rapidly cured.

EXAMPLE 91

The same procedure as in Example 1 was conducted except that 20 parts of the titanocene compound represented by formula (a) in Example 1 were replaced with 20 parts of 3,3',4,4'-tetra(t-butylperoxycarbonyl)benzophenone as a photoreaction initiator, thereby preparing about the same photosensitive solution as in Example 1. Afterward, by the use of this photosensitive solution, a resist film was formed on a substrate in the same manner as in Example 1, and the substrate having the resist film was then irradiated at an intensity of 5 mJ/cm² with a xenon lamp (an ultraviolet wavelength range was cut) and a second harmonic (532 nm) of a YAG laser, and at this time, it was confirmed that the resin was rapidly cured [the cured resin was not dissolved by a developing treatment in which the substrate was immersed in a 1% aqueous sodium carbonate solution (a developing solution) at 30° C. for 1 minute].

Furthermore, after allowed to stand at room temperature for 6 months, the unexposed substrate was irradiated with the xenon lamp having an intensity of 5 mJ/cm² (the ultraviolet wavelength range was cut) and the second harmonic (532 nm) of the YAG laser in the same manner a described above, and at this time, it was confirmed that the resin was rapidly cured.

EXAMPLE 92

The same procedure as in Example 1 was conducted except that 20 parts of the titanocene compound represented by formula (a) in Example 1 were replaced with 20 parts of di-t-butyl diperoxyisophthalate as a photoreaction initiator, thereby preparing about the same photosensitive solution as in Example 1. Afterward, by the use of this photosensitive solution, a resist film was formed on a substrate in the same manner as in Example 1, and the substrate having the resist film was then irradiated at an intensity of 5 mJ/cm² with a xenon lamp (an ultraviolet wavelength range was cut) and a second harmonic (532 nm) of a YAG laser, and at this time, it was confirmed that the resin was rapidly cured [the cured resin was not dissolved by a developing treatment in which the substrate was immersed in a 1% aqueous sodium carbonate solution (a developing solution) at 30° C. for 1 minute].

Furthermore, after allowed to stand at room temperature for 6 months, the unexposed substrate was irradiated with the xenon lamp having an intensity of 5 mJ/cm² (the ultraviolet wavelength range was cut) and the second harmonic (532 nm) of the YAG laser in the same manner as described above, and at this time, it was confirmed that the resin was rapidly cured.

EXAMPLE 93

The same procedure as in Example 1 was conducted except that 1.5 parts of a compound 1-1 shown in Table 1 in Example 1 were replaced with 1 part of a compound 1-88 and 1 part of a compound 1-89 in Table 1, thereby preparing about the same photosensitive solution as in Example 1. Afterward, by the use of this photosensitive solution, a resist film was formed on a substrate in the same manner as in Example 1, and the substrate having the resist film was then irradiated at an intensity of 5 mJ/cm² with a xenon lamp (an ultraviolet wavelength range was cut) and a second harmonic (532 nm) of a YAG laser, and at this time, it was confirmed that the resin was rapidly cured [the cured resin was not dissolved by a developing treatment in which the substrate was immersed in a 1% aqueous sodium carbonate solution (a developing solution) at 30° C. for 1 minute].

Furthermore, after allowed to stand at room temperature for 6 months, the unexposed substrate was irradiated with the xenon lamp having an intensity of 5 mJ/cm² (the ultraviolet wavelength range was cut) and the second harmonic (532 nm) of the YAG laser in the same manner as described above, and at this time, it was confirmed that the resin was rapidly cured.

EXAMPLE 94

The same procedure as in Example 1 was conducted except that 1.5 parts of a compound 1-1 shown in Table 1 in Example 1 were replaced with 1 part of a compound 1-43 and 1 part of a compound 1-90 in Table 1, thereby preparing a photosensitive solution having about the same composition as in Example 1. Afterward, by the use of this photosensitive solution, a resist film was formed on a substrate in the same manner as in Example 1, and the substrate having the resist film was then irradiated at an intensity of 5 mJ/cm² with a xenon lamp (an ultraviolet wavelength range was cut) and a second harmonic (532 nm) of a YAG laser, and at this time, it was confirmed that the resin was rapidly cured [the cured resin was not dissolved by a developing treatment in which the substrate was immersed in a 1% aqueous sodium carbonate solution (a developing solution) at 30° C. for 1 minute].

Furthermore, after allowed to stand at room temperature for 6 months, the unexposed substrate was irradiated with the xenon lamp having an intensity of 5 mJ/cm² (the ultraviolet wavelength range was cut) and the second harmonic (532 nm) of the YAG laser in the same manner as described above, and at this time, it was confirmed that the resin was rapidly cured.

EXAMPLE 95

The same procedure as in Example 1 was conducted except that 100 parts of the acrylic resin in Example 1 were replaced with 100 parts of a photocurable resin (acid value= about 70, and degree of unsaturation=1.83 mol/kg) obtained by adding 35 parts of glycidyl methacrylate to 100 parts of a radical copolymer (acid value=about 233) of methyl acrylate/styrene/acrylic acid=60/10/30 (weight ratio) to carry out an addition reaction, thereby preparing a photosensitive solution having about the same composition as in Example 1. Afterward, by the use of this photosensitive solution, a resist film was formed on a substrate in the same manner as in Example 1, and the substrate having the resist film was then irradiated at an intensity of 5 mJ/cm² with a xenon lamp (an ultraviolet wavelength range was cut) and a second harmonic (532 nm) of a YAG laser, and at this time, it was confirmed that the resin was rapidly cured [the cured resin was not dissolved by a developing treatment in which the substrate was immersed in a 1% aqueous sodium carbonate solution (a developing solution) at 30° C. for 1 minute].

Furthermore, after allowed to stand at room temperature for 6 months, the unexposed substrate was irradiated with the xenon lamp having an intensity of 5 mJ/cm² (the ultraviolet wavelength range was cut) and the second harmonic (532 nm) of the YAG laser in the same manner as described above, and at this time, it was confirmed that the resin was rapidly cured.

EXAMPLE 96

The same procedure as in Example 1 was conducted except that 100 parts of acrylic resin in Example 1 were replaced with a mixture of 50 parts of the acrylic resin and 50 parts of the photocurable resin used in Example 95, thereby preparing a photosensitive solution having about the same composition as in Example 1. Afterward, by the use of this photosensitive solution, a resist film was formed on a substrate in the same manner as in Example 1, and the substrate having the resist film was then irradiated at an intensity of 5 mJ/cm² with a xenon lamp (an ultraviolet wavelength range was cut) and a second harmonic (532 nm) of a YAG laser, and at this time, it was confirmed that the resin was rapidly cured [the cured resin was not dissolved by a developing treatment in which the substrate was immersed in a 1% aqueous sodium carbonate solution (a developing solution) at 30° C. for 1 minute].

Furthermore, after allowed to stand at room temperature for 6 months, the unexposed substrate was irradiated with the xenon lamp having an intensity of 5 mJ/cm² (the ultraviolet wavelength range was cut) and the second harmonic (532 nm) of the YAG laser in the same manner as described above, and at this time, it was confirmed that the resin was rapidly cured.

EXAMPLE 97

The same procedure as in Example 1 was conducted except that 100 parts of the acrylic resin and 55 parts of trimethylolpropane triacrylate in Example 1 were replaced with 155 parts of the photocurable resin used in Example 95, thereby preparing a photosensitive solution having about the same composition as in Example 1. Afterward, by the use of this photosensitive solution, a resist film was formed on a substrate in the same manner as in Example 1, and the substrate having the resist film was then irradiated at an intensity of 5 mJ/cm² with a xenon lamp (an ultraviolet wavelength range was cut) and a second harmonic (532 nm) of a YAG laser, and at this time, it was confirmed that the resin was rapidly cured [the cured resin was not dissolved by a developing treatment in which the substrate was immersed in a 1% aqueous sodium carbonate solution (a developing solution) at 30° C. for 1 minute].

Furthermore, after allowed to stand at room temperature for 6 months, the unexposed substrate was irradiated with the xenon lamp having an intensity of 5 mJ/cm² (the ultraviolet wavelength range was cut) and the second harmonic (532 nm) of the YAG laser in the same manner as described above, and at this time, it was confirmed that the resin was rapidly cured.

EXAMPLE 98

The same procedure as in Example 1 was conducted except that 55 parts of trimethylolpropane triacrylate and 20 parts of the titanocene compound in Example 1 were replaced with an oxetane compound represented by formula (b)

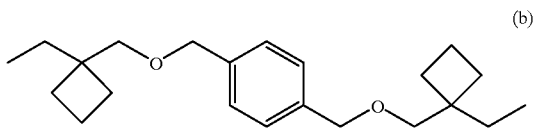

(b)

and 10 parts of a compound represented by formula (c)

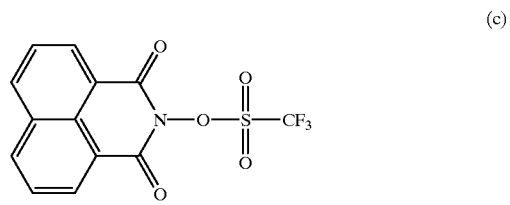

(c)

as a light acid generator, thereby preparing a photosensitive solution having about the same composition as in Example 1. Afterward, by the use of this photosensitive solution, a resist film was formed on a substrate in the same manner as in Example 1, and the substrate having the resist film was then irradiated at an intensity of 5 mJ/cm$^2$ with a xenon lamp (an ultraviolet wavelength range was cut) and a second harmonic (532 nm) of a YAG laser, and at this time, it was confirmed that the resin was rapidly cured [the cured resin was not dissolved by a developing treatment in which the substrate was immersed in a 1% aqueous sodium carbonate solution (a developing solution) at 30° C. for 1 minute].

Furthermore, after allowed to stand at room temperature for 6 months, the unexposed substrate was irradiated with the xenon lamp having an intensity of 5 mJ/cm$^2$ (the ultraviolet wavelength range was cut) and the second harmonic (532 nm) of the YAG laser in the same manner as described above, and at this time, it was confirmed that the resin was rapidly cured.

EXAMPLE 99

100 parts (solid content) of the photosensitive solution obtained in Example 95 were mixed with 7 parts of triethylamine, and after stirring, the mixture was then dispersed in deionized water to obtain an aqueous resin dispersion (solid content=15%).

Anionic electrodeposition coating was carried out so that the thickness of a dry film might be 5 μm under conditions that the thus obtained aqueous resin dispersion was used as an electrodeposition coating bath and a laminated copper plate was used as an anode. Afterward, the plate having the film was washed with water, and then dried at 80° C. for 5 minutes to obtain an electrodeposited photosensitive layer. This photosensitive layer was irradiated at an intensity of 5 mJ/cm$^2$ with a xenon lamp (an ultraviolet wavelength range was cut) and a second harmonic (532 nm) of a YAG laser, and at this time, it was confirmed that the resin was rapidly cured [the cured resin was not dissolved by a developing treatment in which the substrate was immersed in a 1% aqueous sodium carbonate solution (a developing solution) at 30° C. for 1 minute].

Furthermore, after allowed to stand at room temperature for 6 months, the photosensitive layer was irradiated with the xenon lamp having an intensity of 5 mJ/cm$^2$ (the ultraviolet wavelength range was cut) and the second harmonic (532 nm) of the YAG laser in the same manner as described above, and at this time, it was confirmed that the resin was rapidly cured.

EXAMPLE 100

100 parts of a photocurable resin (amine value=about 56, and degree of unsaturation=1.83 mol/kg) obtained by adding 15 parts of acrylic acid to 100 parts of a radical copolymer of methyl acrylate/styrene/butyl acrylate/glycidyl methacrylate/dimethylaminoethyl methacrylate=20/10/22/30/18 (weight ratio) to carry out an addition reaction were mixed with 1.5 parts of a compound 1-1 in Table 1, 55 parts of trimethylolpropane triacrylate and 20 parts of the same titanocene compound as used in Example 1 to obtain a photosensitive solution. Afterward, 100 parts (solid content) of this photosensitive solution were mixed with 3 parts of acetic acid, and the mixture was then dispersed in deionized water to obtain an aqueous resin dispersion (solid content=15%).

Cationic electrodeposition coating was carried out so that the thickness of a dry film might be 5 μm under conditions that the thus obtained aqueous resin dispersion was used as an electrodeposition coating bath and a laminated copper plate was used as an anode. Afterward, the plate having the film was washed with water, and then dried at 80° C. for 5 minutes to obtain an electrodeposited photosensitive layer. This photosensitive layer was irradiated at an intensity of 5 mJ/cm$^2$ with a xenon lamp (an ultraviolet wavelength range was cut) and a second harmonic (532 nm) of a YAG laser, and at this time, it was confirmed that the resin was rapidly cured [the cured resin was not dissolved by a developing treatment in which the substrate was immersed in a 2.38% aqueous tetramethylammonium hydroxide solution (a developing solution) at 30° C. for 1 minute].

Furthermore, after allowed to stand at room temperature for 6 months, the photosensitive layer was irradiated with the xenon lamp having an intensity of 5 mJ/cm$^2$ (the ultraviolet wavelength range was cut) and the second harmonic (532 nm) of the YAG laser in the same manner as described above, and at this time, it was confirmed that the resin was rapidly cured.

EXAMPLE 101

The same procedure as in Example 1 was conducted except that 3 parts of N,N-dimethylaniline were added as a radical protecting compound, thereby preparing a photosensitive solution having about the same composition as in Example 1. Afterward, by the use of this photosensitive solution, a resist film was formed on a substrate in the same manner as in Example 1, and the substrate having the resist film was then irradiated at an intensity of 2 mJ/cm$^2$ with a xenon lamp (an ultraviolet wavelength range was cut) and a second harmonic (532 nm) of a YAG laser, and at this time, it was confirmed that the resin was rapidly cured [the cured resin was not dissolved by a developing treatment in which the substrate was immersed in a 1% aqueous sodium carbonate solution (a developing solution) at 30° C. for 1 minute].

Furthermore, after allowed to stand at room temperature for 6 months, the unexposed substrate was irradiated with the xenon lamp having an intensity of 5 mJ/cm$^2$ (the ultraviolet wavelength range was cut) and the second harmonic (532 nm) of the YAG laser in the same manner as described above, and at this time, it was confirmed that the resin was rapidly cured.

EXAMPLES 102 TO 190

The same procedure as in each of Examples 2 to 90 was conducted except that 3 parts of N,N-dimethylaniline were added as a radical protecting compound, thereby preparing a photosensitive solution. Afterward, by the use of this photosensitive solution, a resist film was formed on a substrate in the same manner as in Example 1, and the substrate having the resist film was then irradiated at an intensity of 2 mJ/cm$^2$ with a xenon lamp (an ultraviolet wavelength range was cut) and a second harmonic (532 nm) of a YAG laser, and at this time, it was confirmed that the resin was rapidly cured [the cured resin was not dissolved by a developing treatment in which the substrate was immersed in a 1% aqueous sodium carbonate solution (a developing solution) at 30° C. for 1 minute].

Furthermore, after allowed to stand at room temperature for 6 months, the unexposed substrate was irradiated with the xenon lamp having an intensity of 5 mJ/cm$^2$ (the ultraviolet wavelength range was cut) and the second harmonic (532 nm) of the YAG laser in the same manner as described above, and at this time, it was confirmed that the resin was rapidly cured.

EXAMPLE 191

The same procedure as in Example 1 was conducted except that 5 parts of triethylphosphite were added as a radical protecting compound, thereby preparing a photosensitive solution. Afterward, by the use of this photosensitive solution, a resist film was formed on a substrate in the same manner as in Example 1, and the substrate having the resist film was then irradiated at an intensity of 2 mJ/cm$^2$ with a xenon lamp (an ultraviolet wavelength range was cut) and a second harmonic (532 nm) of a YAG laser, and at this time, it was confirmed that the resin was rapidly cured [the cured resin was not dissolved by a developing treatment in which the substrate was immersed in a 1% aqueous sodium carbonate solution (a developing solution) at 30° C. for 1 minute].

Furthermore, after allowed to stand at room temperature for 6 months, the unexposed substrate was irradiated with the xenon lamp having an intensity of 5 mJ/cm$^2$ (the ultraviolet wavelength range was cut) and the second harmonic (532 nm) of the YAG laser in the same manner as described above, and at this time, it was confirmed that the resin was rapidly cured.

EXAMPLE 192

A photosensitive solution was prepared by using 100 parts of a radical copolymer (toluene solution) of methacrylic acid/styrene/methyl acrylate/methyl methacrylate=20/10/20/50 (parts by weight), 60 parts of tetraethyleneglycol dimethacrylate, 1.5 parts of a compound 1-1 as a photosensitizer in Table 1, 1 part of the titanocene compound used in Example 1. This photosensitive solution was applied onto polyester film having 25 μm in thickness by using blade coater, and then dried at 100° C. to obtain a visible light curable resin composition layer having 50 μm in thickness. Afterward, a polyethylene film having 35 μm in thickness was laminated as a protection film on the dried coated film to obtain a dry film resist. Thus obtained dry film resist was subjected to heat-lamination on a copper-plated multilayer substrate with pealing off the protection film so that a photosensitive layer according to the dry film was prepared.

The substrate having the photosensitive layer was then irradiated at an intensity of 5 mJ/cm$^2$ with a xenon lamp (an ultraviolet wavelength range was cut) and a second harmonic (532 nm) of a YAG laser. The polyester film was pealed off from the surface of the photosensitive layer. The exposed parts were not dissolved by a developing treatment in which the substrate was immersed in a 1% aqueous sodium carbonate solution (a developing solution) at 30° C. for 1 minute. On the other hand, unexposed parts were washed off by the developing solution. That is, it was recognized that the dry film was good.

Furthermore, after allowed to stand at room temperature for 6 months, the unexposed substrate was evaluated in the same manner as described above, and at this time, it was confirmed that the photosensitivity was not changed.

EXAMPLES 193–281

The same procedure as in Example 192 was conducted except that compounds 1-2 to 1-90 in Table 1 were used as photosensitizers, thereby preparing photosensitive solutions. Afterward, by the use of each of these photosensitive solutions, a photosensitive layer was formed on a substrate in the same manner as in Example 192, and the substrate having the photosensitive layer was then irradiated at an intensity of 5 mJ/cm$^2$ with a xenon lamp (an ultraviolet wavelength range was cut) and a second harmonic (532 nm) of a YAG laser, and at this time, it was confirmed that the resin was rapidly cured [the cured resin was not dissolved by a developing treatment in which the substrate was immersed in a 1% aqueous sodium carbonate solution (a developing solution) at 30° C. for 1 minute].

Furthermore, after allowed to stand at room temperature for 6 months, the unexposed substrate was evaluated in the same manner as described above, and at this time, it was confirmed that the photosensitivity was not changed.

EXAMPLE 282

The photosensitive solution obtained in Example 1 was applied onto a copper-plated glass-fiber-reinforced epoxy substrate in a dark room by a bar coater so that the thickness of a dry film might be 5 μm, and it was then dried at 60° C. for 10 minutes to prepare the substrate having a resist film.

Next, the surface of the thus obtained substrate having the resist film was irradiated with a sodium lamp shown in FIG. 1 at a luminous intensity of 40 lux for 24 hours. Afterward, this substrate having the resist film was heated at 120° C. for 30 minutes in the dark room, and then immersed in a 1% aqueous sodium carbonate solution as a developing solution at 30° C. for 1 minute. As a result, the resist film was completely dissolved in the aqueous sodium carbonate solution, which meant that photocuring did not occur at all conveniently by the irradiation of the sodium lamp.

Figure 4:
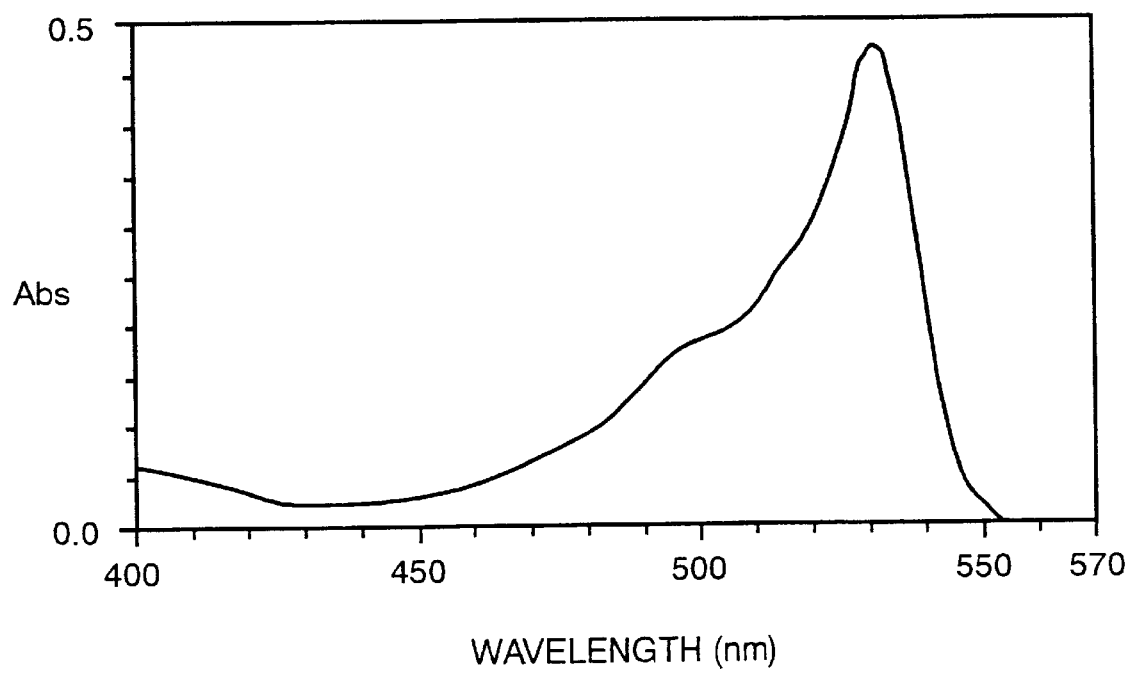
FIG. 4 is a graph showing an absorbance curve of a resist film used in Example 1.

The above-mentioned photosensitive solution was applied onto a transparent polyethylene terephthalate sheet by a bar coater so that the thickness of a coating film might be 5 μm, and it was then dried at 60° C. for 10 minutes. Next, the absorbency of this coating film was measured. The results are shown in FIG. 4. The ordinate represents the absorbency, and the abscissa represents a wavelength nm.

It was confirmed from the wavelength of a safelight in FIG. 1 and an absorbency curve in FIG. 4 that the safelight did not have a bad influence on the photosensitive solution, and it was also confirmed from a spectral luminous efficiency curve in FIG. 3 that this safelight was a bright light.

EXAMPLES 283 TO 371

The photosensitive solution obtained in each of Examples 2 to 90 was applied onto a copper-plated glass-fiber-reinforced epoxy substrate in a dark room by a bar coater so that the thickness of a dry film might be 5 µm, and it was then dried at 60° C. for 10 minutes to prepare the substrate having a resist film.

Next, the surface of the thus obtained substrate having the resist film (the thickness of the dry resist film=5 µm) was irradiated with a sodium lamp shown in FIG. 1 at a luminous intensity of 40 lux for 24 hours. Afterward, this substrate having the resist film was heated at 120° C. for 30 minutes in the dark room, and then immersed in a 1% aqueous sodium carbonate solution as a developing solution at 30° C. for 1 minute. As a result, the resist film was completely dissolved in the aqueous sodium carbonate solution, which meant that photocuring did not occur at all conveniently by the irradiation of the sodium lamp.

COMPARATIVE EXAMPLES 1 TO 90

The same procedure as in each of Examples 282 to 371 was conducted except that the sodium lamp in Examples 282 to 371 was replaced with a fluorescent lamp, thereby preparing a substrate having a resist film. In addition, the thus obtained substrate was immersed in a 1% aqueous sodium carbonate solution in the same manner as in Example 1. As a result, the resist film was not dissolved in the aqueous sodium carbonate solution inconveniently.

A spectral distribution of a fluorescence or the like used in Comparative Examples 1 to 90 is shown in FIG. 5.

What is claimed is:

1. A photosensitizer having at least one dipyrromethene boron complex compound represented by formula (5):

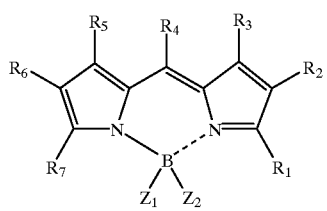

(5)

wherein $R_1$, $R_2$, $R_3$, $R_5$, $R_6$ and $R_7$ are each independently a hydrogen atom, a halogen atom, a cyano group, a hydroxyl group, an amino group, an alkyl or an alkylthio group having 1 to 20 carbon atoms which may have a substituent or substituents, an aryl or an arylthio group having 6 to 20 carbon atoms which may have a substituent or substituents, an aralkyl group having 7 to 20 carbon atoms which may have a substituent or substituents, a heteroaryl group having 2 to 20 carbon atoms which may have a substituent or substituents, an alkenyl group having 2 to 10 carbon atoms which may have a substituent or substituents, or a group represented by formula (3) or (4):

(3)

wherein Q is a hydrogen atom, an amino group, an alkyl or an alkoxy group having 1 to 20 carbon atoms which may have a substituent or substituents, an aralkyl or an aralkyloxy group having 7 to 20 carbon atoms which may have a substituent or substituents, an aryl, an aryloxy or an arylamino group having 6 to 20 carbon atoms which may have a substituent or substituents, an alkenyloxy group having 2 to 10 carbon atoms which may have a substituent or substituents, a monoalkylamino group having 1 to 10 carbon atoms which may have a substituent or substituents, a dialkylamino group having 2 to 20 carbon atoms which may have a substituent or substituents, or an alkylcarbonylalkoxy group or an alkoxycarbonylalkoxy group having 3 to 20 carbon atoms which may have a substituent or substituents,

(4)

wherein L is an alkylcarbonyl group having 2 to 10 carbon atoms which may have a substituent or substituents or an arylcarbonyl group having 7 to 15 carbon atoms which may have a substituent or substituents;

$R_4$ is a hydrogen atom, a cyano group, an alkyl group having 1 to 20 carbon atoms which may have a substituent or substituents, an aralkyl group having 7 to 20 carbon atoms which may have a substituent or substituents, an aryl group having 6 to 20 carbon atoms which may have a substituent or substituents, a heteroaryl group having 2 to 20 carbon atoms which may have a substituent or substituents, or an alkenyl group having 2 to 10 carbon atoms which may have a substituent or substituents;

$Z_1$ and $Z_2$ are each independently a halogen atom, an alkyl, an alkoxy or an alkylthio group having 1 to 20 carbon atoms which may have a substituent or substituents, an aralkyl or an aralkyloxy group having 7 to 20 carbon atoms which may have a substituent or substituents, an aryl, an aryloxy or an arylthio group having 6 to 20 carbon atoms which may have a substituent or substituents, a heteroaryl, a heteroaryloxy or a heteroarylthio group having 2 to 20 carbon atoms which may have a substituent or substituents;

provided that at least one of $Z_1$ and $Z_2$ is the alkoxy, aralkyloxy or aryloxy group.

2. The photosensitizer according to claim 1 wherein at least one of $Z_1$ and $Z_2$ is an alkoxy group or an aralkyloxy group which may have a substituent or substituents.

3. The photosensitizer according to claim 2 wherein $R_1$, $R_2$, $R_3$, $R_5$, $R_6$ and $R_7$ are each independently a hydrogen atom, or a straight chain or branched alkyl group having 1 to 4 carbon atoms which may have a substituent or substituents; $R_4$ is a hydrogen atom; and at least one of $Z_1$ and $Z_2$ is a straight chain, branched or cyclic alkoxy group having 1 to 7 carbon atoms or a benzyloxy group which may have a substituent or substituents.

4. A visible light curable resin composition which comprises a photocurable resin (A), a photoreaction initiator (B) and a photosensitizer (C), the photosensitizer described claim 3 being used as the photosensitizer (C).

5. The visible light curable resin composition according to claim 4 which further contains a radical protecting compound (D).

6. The visible light curable resin composition according to claim 5 wherein the radical protecting compound (D) contains at least one radical protecting compound selected from phosphorous acid ester compounds and aromatic compounds having an N,N-dimethyl amino group bonded to a carbon atom which forms an aromatic ring.

7. The visible light curable resin composition according to claim 4 which is used under an irradiation circumstance of a safelight having a high spectral luminous efficiency and a maximum wavelength selected within the range of 500 to 620 nm and in which an absorbency of the unexposed coating film formed from the composition is 0.5 or less within the range of the maximum wavelength ±30 nm of the safelight.

8. An ink for a visible light curable material which comprises a visible light curable resin composition described claim 7 and a solvent.

9. A visible light curable material which comprises a substrate and the visible light curable resin composition described claim 7 on the substrate.

10. An ink for a visible light curable material which comprises a visible light curable resin composition described in claim 4 and a solvent.

11. A visible light curable material which comprises a substrate and the visible light curable resin composition described in claim 4 on the substrate.

12. A visible light curable resin composition which comprises a photocurable resin (A), a photoreaction initiator (B) and a photosensitizer (C), the photosensitizer described in claim 2 being used as the photosensitizer (C).

13. The visible light curable resin composition according to claim 12 which further contains a radical protecting compound (D).

14. The visible light curable resin composition according to claim 13 wherein the radical protecting compound (D) contains at least one radical protecting compound selected from phosphorous acid ester compounds and aromatic compounds having an N,N-dimethyl amino group bonded to a carbon atom which forms an aromatic ring.

15. The visible light curable resin composition according to claim 12 which is used under an irradiation circumstance of a safelight having a high spectral luminous efficiency and a maximum wavelength selected within the range of 500 to 620 nm and in which an absorbency of the unexposed coating film formed from the composition is 0.5 or less within the range of the maximum wavelength ±30 nm of the safelight.

16. An ink for a visible light curable material which comprises a visible light curable resin composition described in claim 12 and a solvent.

17. A visible light curable material which comprises a substrate and the visible light curable resin composition described in claim 12 on the substrate.

18. A visible light curable material which comprises a substrate and the visible light curable resin composition described in claim 12 on the substrate.

19. A visible light curable resin composition which comprises a photocurable resin (A), a photoreaction initiator (B) and a photosensitizer (C), the photosensitizer described in claim 1 being used as the photosensitizer (C).

20. The visible light curable resin composition according to claim 19 which further contains a radical protecting compound (D).

21. The visible light curable resin composition according to claim 20 wherein the radical protecting compound (D) contains at least one radical protecting compound selected from phosphorous acid ester compounds and aromatic compounds having an N,N-dimethyl amino group bonded to a carbon atom which forms an aromatic ring.

22. The visible light curable resin composition according to claim 19 which is used under an irradiation circumstance of a safelight having a high spectral luminous efficiency and a maximum wavelength selected within the range of 500 to 620 nm and in which an absorbency of the unexposed coating film formed from the composition is 0.5 or less within the range of the maximum wavelength ±30 nm of the safelight.

23. An ink for a visible light curable material which comprises a visible light curable resin composition described in claim 19 and a solvent.

24. A visible light curable resin composition which comprises a photocurable resin (A), a photoreaction initiator (B) and a photosensitizer (C), the photosensitizer being at least one dipyrromethene boron complex compound represented by formula (2):

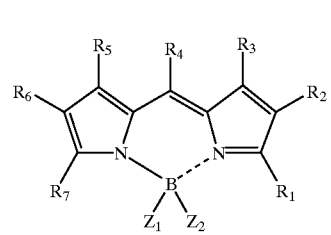

(2)

wherein $R_1$, $R_2$, $R_3$, $R_5$, $R_6$ and $R_7$ are each independently a hydrogen atom, a halogen atom, a cyano group, a hydroxyl group, an amino group, an alkyl, an alkoxy or an alkylthio group having 1 to 20 carbon atoms which may have a substituent or substituents, an aryl, an aryloxy or an arylthio group having 6 to 20 carbon atoms which may have a substituent or substituents, an aralkyl or an aralkyloxy group having 7 to 20 carbon atoms which may have a substituent or substituents, a heteroaryl group having 2 to 20 carbon atoms which may have a substituent or substituents, an alkenyl group having 2 to 10 carbon atoms which may have a substituent or substituents, or a group represented by formula (3) or (4):

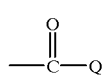

(3)

wherein Q is a hydrogen atom, an amino group, an alkyl or an alkoxy group having 1 to 20 carbon atoms which may have a substituent or substituents, an aralkyl or an aralkyloxy group having 7 to 20 carbon atoms which may have a substituent or substituents, an aryl, an aryloxy or an arylamino group having 6 to 20 carbon atoms which may have a substituent or substituents, an alkenyloxy group having 2 to 10 carbon atoms which may have a substituent or substituents, a monoalkylamino group having 1 to 10 carbon atoms which may have a substituent or substituents, a dialkylamino group having 2 to 20 carbon atoms which may have a substituent or substituents, or an alkylcarbonylalkoxy group or an alkoxycarbonylalkoxy group having 3 to 20 carbon atoms which may have a substituent or substituents,

—NH—L (4)

wherein L is an alkylcarbonyl group having 2 to 10 carbon atoms which may have a substituent or substituents or an arylcarbonyl group having 7 to 15 carbon atoms which may have a substituent or substituents;

$R_4$ is a hydrogen atom, a cyano group, an alkyl group having 1 to 20 carbon atoms which may have a substituent or substituents, an aralkyl group having 7 to 20 carbon atoms which may have a substituent or substituents, an aryl group having 6 to 20 carbon atoms which may have a substituent or substituents, a heteroaryl group having 2 to 20 carbon atoms which may have a substituent or substituents, or an alkenyl group having 2 to 10 carbon atoms which may have a substituent or substituents;

$Z_1$ and $Z_2$ are each independently a halogen atom, an alkyl group, an alkoxy or an alkylthio group having 1 to 20 carbon atoms which may have a substituent or substituents, an aralkyl or an aralkyloxy group having 7 to 20 carbon atoms which may have a substituent or substituents, an aryl, an aryloxy or an arylthio group having 6 to 20 carbon atoms which may have a substituent or substituents, a heteroaryl, a heteroaryloxy or a heteroarylthio group having 2 to 20 carbon atoms which may have a substituent or substituents; provided that at least one of $R_1$, $R_2$, $R_3$, $R_5$, $R_6$ and $R_7$ is the alkoxy, aralkyloxy or aryloxy group.

25. The visible light curable resin composition according to claim 24 which further contains a radical protecting compound (D).

26. The visible light curable resin composition according to claim 25 wherein the radical protecting compound (D) contains at least one radical protecting compound selected from phosphorous acid ester compounds and aromatic compounds having an N,N-dimethyl amino group bonded to a carbon atom which forms an aromatic ring.

27. The visible light curable resin composition according to claim 24 which is used under an irradiation circumstance of a safelight having a high spectral luminous efficiency and a maximum wavelength selected within the range of 500 to 620 nm and in which an absorbency of the unexposed coating film formed from the composition is 0.5 or less within the range of the maximum wavelength ±30 nm of the safelight.

28. An ink for a visible light curable material which comprises a visible light curable resin composition described in claim 24 and a solvent.

29. A visible light curable material which comprises a substrate and the visible light curable resin composition described in claim 24 on the substrate.

30. A visible light curable resin composition which comprises a photocurable resin (A), a photoreaction initiator (B) and a photosensitizer (C), the photosensitizer being at least one dipyrromethene boron complex compound represented by formula (1):

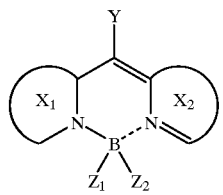

(1)

wherein rings $X_1$ and $X_2$ are each a pyrrole ring which may have a substituent or substituents; Y is a hydrogen atom, a cyano group, or an alkyl, an aralkyl, an aryl, a heteroaryl or an alkenyl group which may have a substituent or substituents; and $Z_1$ and $Z_2$ are each independently a halogen atom, or an alkoxy, an alkyl, an aralkyl, an aralkyloxy, an aryl, a heteroaryl, an alkylthio, an aryloxy, an arylthio, a heteroaryloxy or a heteroarylthio group which may have a substituent or substituents, provided that at least one of substituents on the pyrrole rings $X_1$ and $X_2$ as well as the groups $Z_1$ and $Z_2$ is an alkoxy, an aralkyloxy or an aryloxy group which may have a substituent or substituents.

31. The visible light curable resin composition according to claim 30 which further contains a radical protecting compound (D).

32. The visible light curable resin composition according to claim 31 wherein the radical protecting compound (D) contains at least one radical protecting compound selected from phosphorous acid ester compounds and aromatic compounds having an N,N-dimethyl amino group bonded to a carbon atom which forms an aromatic ring.

33. The visible light curable resin composition according to claim 30 which is used under an irradiation circumstance of a safelight having a high spectral luminous efficiency and a maximum wavelength selected within the range of 500 to 620 nm and in which an absorbency of the unexposed coating film formed from the composition is 0.5 or less within the range of the maximum wavelength ±30 nm of the safelight.

34. An ink for a visible light curable material which comprises a visible light curable resin composition described in claim 30 and a solvent.

35. A visible light curable material which comprises a substrate and the visible light curable resin composition described in claim 30 on the substrate.

* * * * *

UNITED STATES PATENT AND TRADEMARK OFFICE
CERTIFICATE OF CORRECTION

PATENT NO.    : 6,106,999
DATED         : August 22, 2000
INVENTOR(S)   : Akira Ogisco et al.

It is certified that error appears in the above-identified patent and that said Letters Patent is hereby corrected as shown below:

<u>Title page,</u>
Item [56], under OTHER PUBLICATIONS, in the first Falk reference, change "mental" to -- metal --.

<u>Column 79,</u>
Line 18, before "claim" insert -- in --;
Line 21, before "claim" insert -- in --.

Signed and Sealed this

Twenty-eighth Day of May, 2002

Attest:

JAMES E. ROGAN
*Attesting Officer*            *Director of the United States Patent and Trademark Office*

UNITED STATES PATENT AND TRADEMARK OFFICE
CERTIFICATE OF CORRECTION

PATENT NO. : 6,106,999
DATED : August 22, 2000
INVENTOR(S) : Akira Ogiso et al.

It is certified that error appears in the above-identified patent and that said Letters Patent is hereby corrected as shown below:

<u>Title page,</u>
Item [73], after "Chemicals" insert -- , Inc. --; change ";" to -- and --.

Signed and Sealed this

Twenty-second Day of April, 2003

JAMES E. ROGAN
*Director of the United States Patent and Trademark Office*